(12) United States Patent
Ibuki et al.

(10) Patent No.: US 8,710,824 B2
(45) Date of Patent: *Apr. 29, 2014

(54) VOLTAGE DETECTOR HAVING VOLTAGE DETECTION PRINTED BOARD

(75) Inventors: Yoshifumi Ibuki, Osaka (JP); Shigeki Amadatsu, Osaka (JP); Tomohiko Kitano, Osaka (JP); Shuji Omae, Osaka (JP)

(73) Assignee: Daihen Corporation, Osaka (JP)

( * ) Notice: Subject to any disclaimer, the term of this patent is extended or adjusted under 35 U.S.C. 154(b) by 342 days.

This patent is subject to a terminal disclaimer.

(21) Appl. No.: 13/196,325

(22) Filed: Aug. 2, 2011

(65) Prior Publication Data

US 2011/0285412 A1     Nov. 24, 2011

Related U.S. Application Data

(63) Continuation of application No. 12/732,773, filed on Mar. 26, 2010, now abandoned, which is a continuation of application No. 11/627,703, filed on Jan. 26, 2007, now Pat. No. 7,714,594.

(30) Foreign Application Priority Data

Jan. 30, 2006    (JP) ................................ 2006/021528
Jul. 31, 2006    (JP) ................................ 2006-208966

(51) Int. Cl.
    *G01R 1/20*          (2006.01)
    *G01R 15/18*        (2006.01)
    *G01R 27/26*        (2006.01)

(52) U.S. Cl.
    USPC ............................ 324/126; 324/127; 324/686

(58) Field of Classification Search
    USPC .......................................... 324/126, 127, 686
    See application file for complete search history.

(56) References Cited

U.S. PATENT DOCUMENTS

| 4,794,327 A | 12/1988 | Fernandes |
| 4,794,328 A | 12/1988 | Fernandes et al. |
| 5,414,400 A | 5/1995 | Gris et al. |

(Continued)

FOREIGN PATENT DOCUMENTS

| JP | 6-176947 | 6/1994 |
| JP | 2003-130894 | 5/2003 |
| JP | 2003-302431 | 10/2003 |
| JP | 2003-315373 | 11/2003 |

(Continued)

OTHER PUBLICATIONS

Japan Office action, dated May 31, 2011 along with an english translation thereof.

(Continued)

*Primary Examiner* — Amy He
(74) *Attorney, Agent, or Firm* — Greenblum & Bernstein, P.L.C.

(57) ABSTRACT

A voltage detector having a voltage detection printed board including a board having a penetration hole that penetrates the board, a first pattern wire formed at a periphery of the penetration hole, a second pattern wire formed at the periphery of the penetration hole, and a plurality of through holes that penetrate the board between the first and second pattern wires. Also provided is a conductive casing in which the voltage detection printed board is fixed, wherein, when a conductor, in which AC voltage is generated, is disposed to pass through the penetration hole, the pattern wires act with the conductor to function as electrodes of a capacitor.

5 Claims, 25 Drawing Sheets

(56) References Cited

U.S. PATENT DOCUMENTS

| | | | |
|---|---|---|---|
| 5,473,244 | A | 12/1995 | Libove et al. |
| 6,313,623 | B1 | 11/2001 | Kojovic et al. |
| 6,661,324 | B1 | 12/2003 | Gilmore |
| 6,708,123 | B2 | 3/2004 | Gerrish |
| 6,731,193 | B2 | 5/2004 | Meier et al. |
| 6,946,847 | B2 | 9/2005 | Nishimori et al. |
| 7,106,162 | B2 | 9/2006 | Saito |
| 7,158,012 | B2 | 1/2007 | Wiesman et al. |
| 7,227,442 | B2 * | 6/2007 | Skendzic .................. 336/229 |
| 2003/0137388 | A1 | 7/2003 | Meier et al. |
| 2003/0214313 | A1 | 11/2003 | Omura et al. |
| 2004/0178875 | A1 | 9/2004 | Saito |
| 2005/0156587 | A1 | 7/2005 | Yakymyshyn et al. |
| 2005/0248430 | A1 | 11/2005 | Dupraz et al. |

FOREIGN PATENT DOCUMENTS

| | | |
|---|---|---|
| JP | 2004-14925 | 1/2004 |
| JP | 2004-085446 | 3/2004 |
| JP | 2004-119926 | 4/2004 |

OTHER PUBLICATIONS

Japan Office action, dated Jun. 21, 2011 along with an english translation thereof.

Japan (JP 2006-208966) Office action, dated Sep. 20, 2011 along with an English translation thereof.

Japan (JP 2006-234514) Office action, dated Oct. 25, 2011 along with an English translation thereof.

Japan (JP 2011-180822) Office action, dated Oct. 25, 2011 along with an English translation thereof.

* cited by examiner

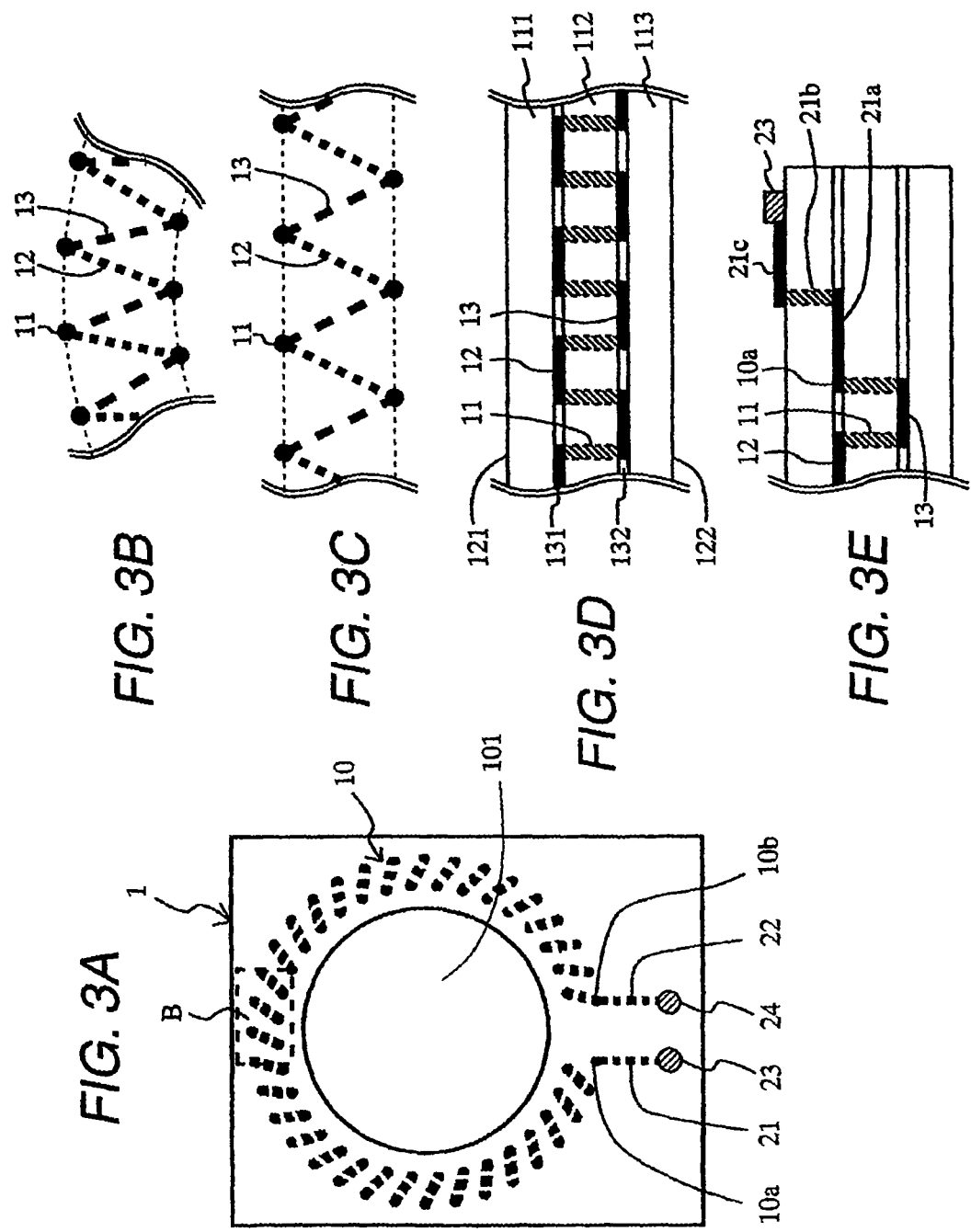

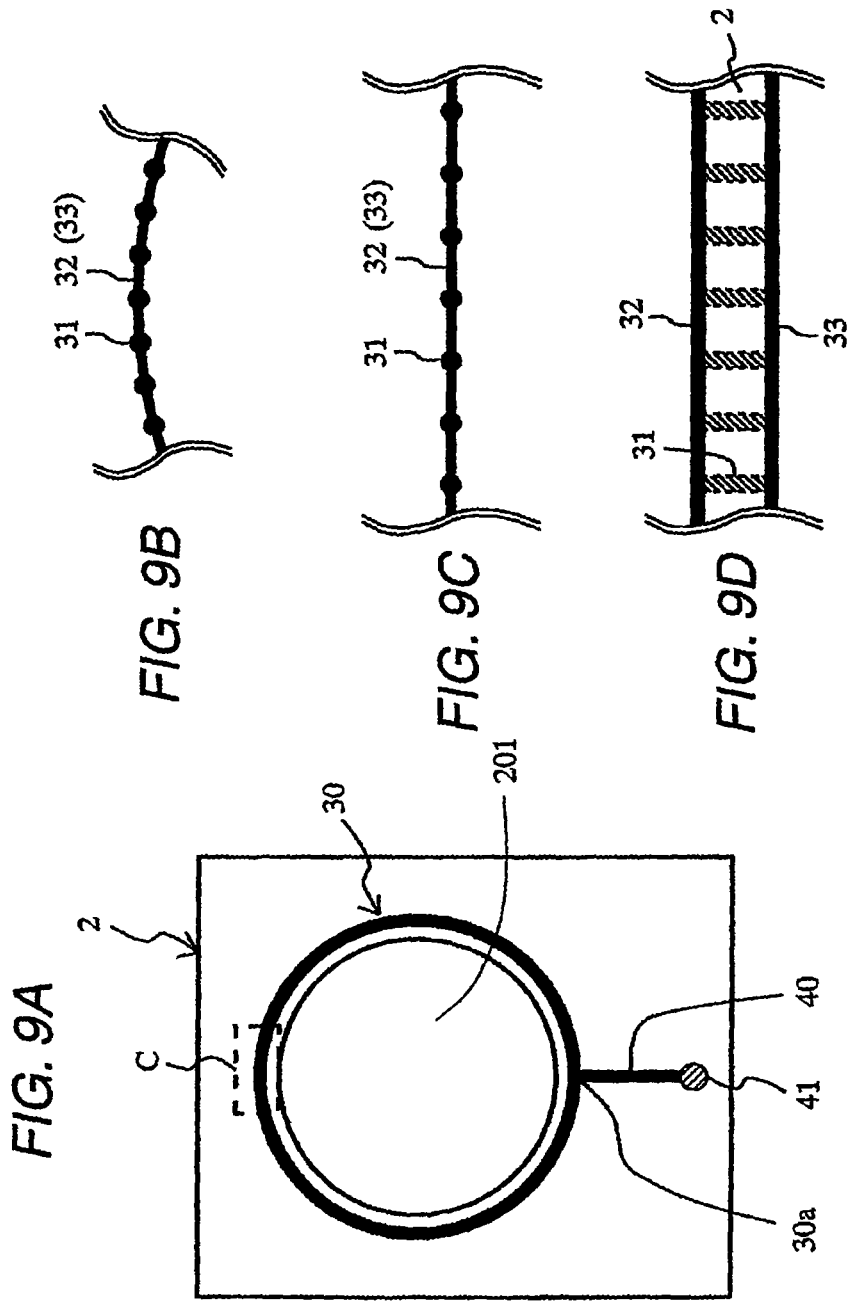

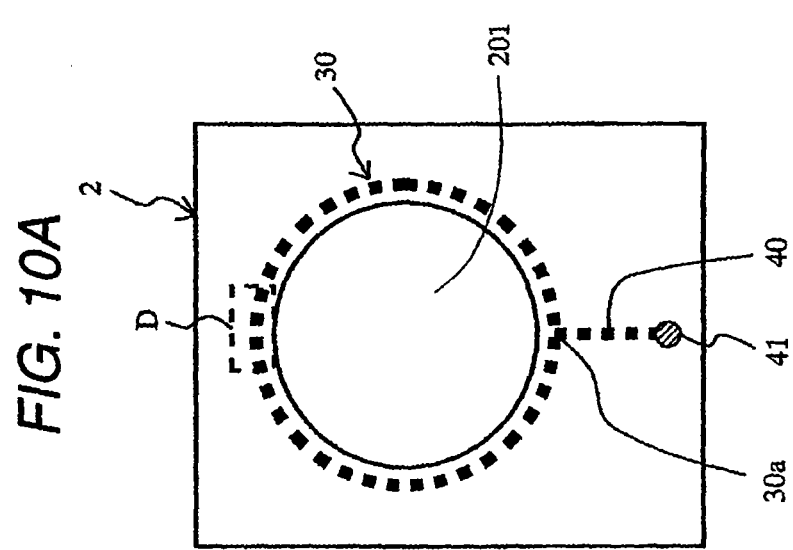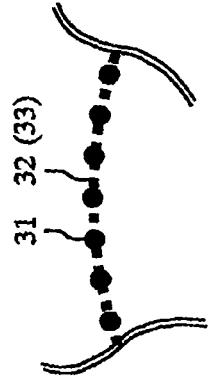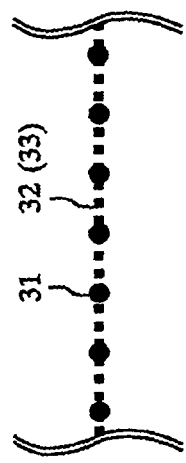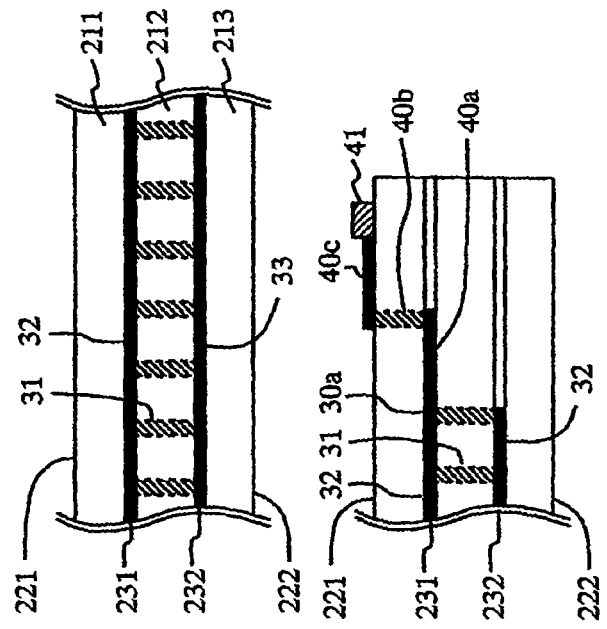
FIG. 10A
FIG. 10B
FIG. 10C
FIG. 10D
FIG. 10E

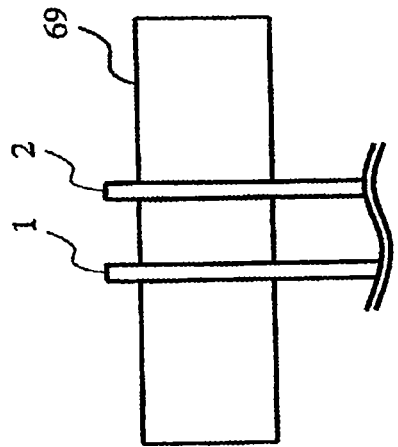
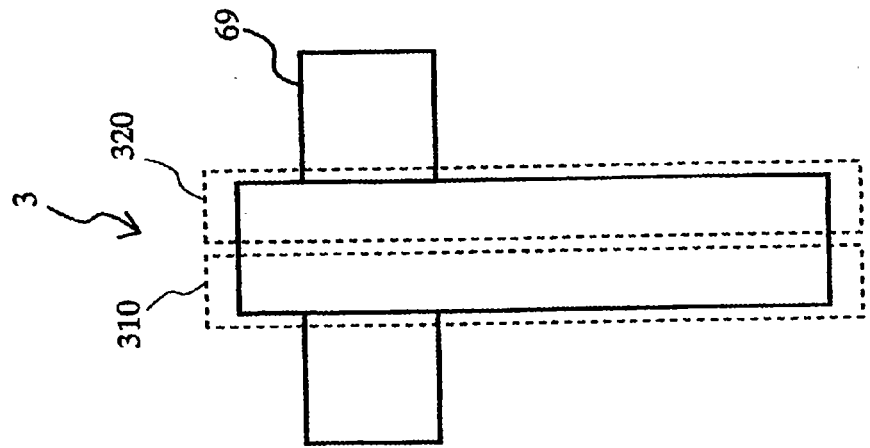
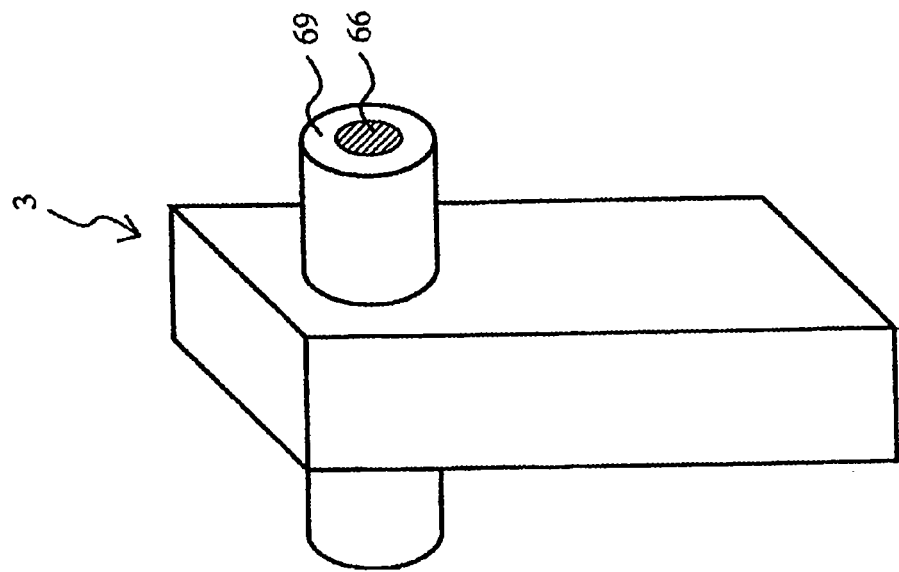

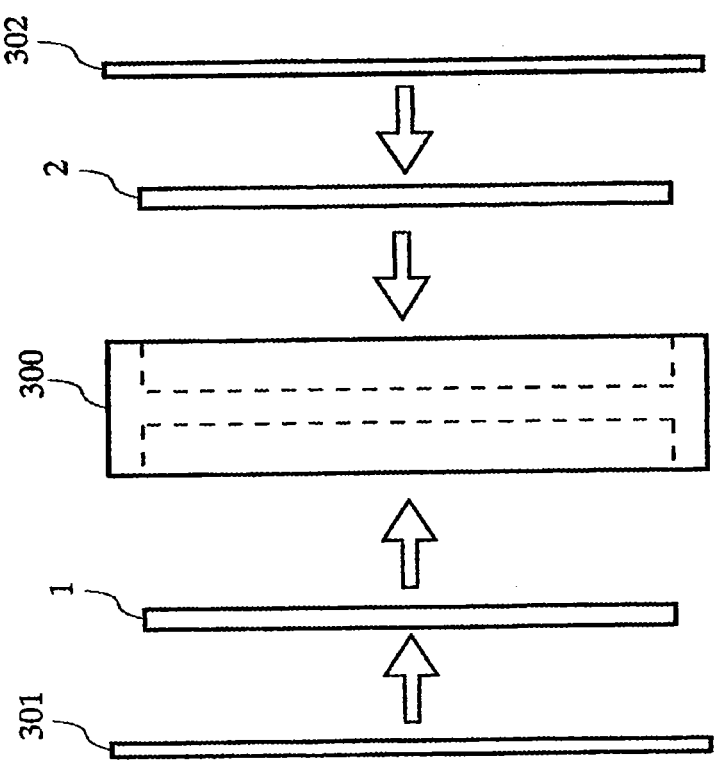
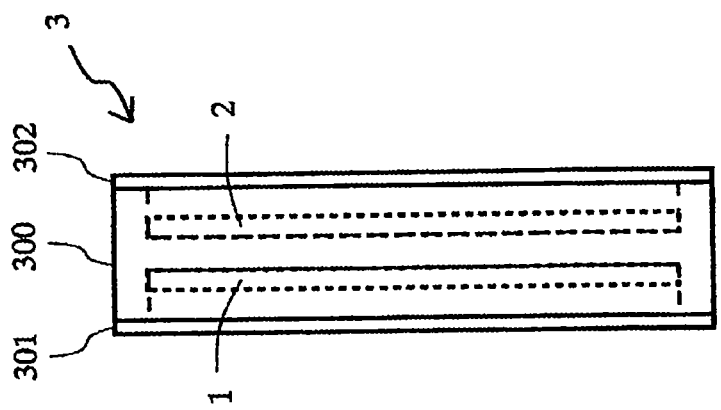
FIG. 13A
FIG. 13B

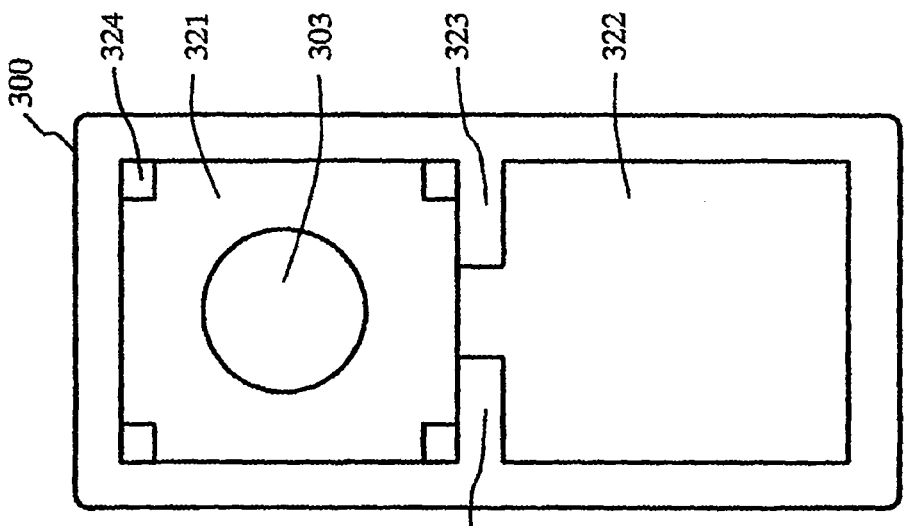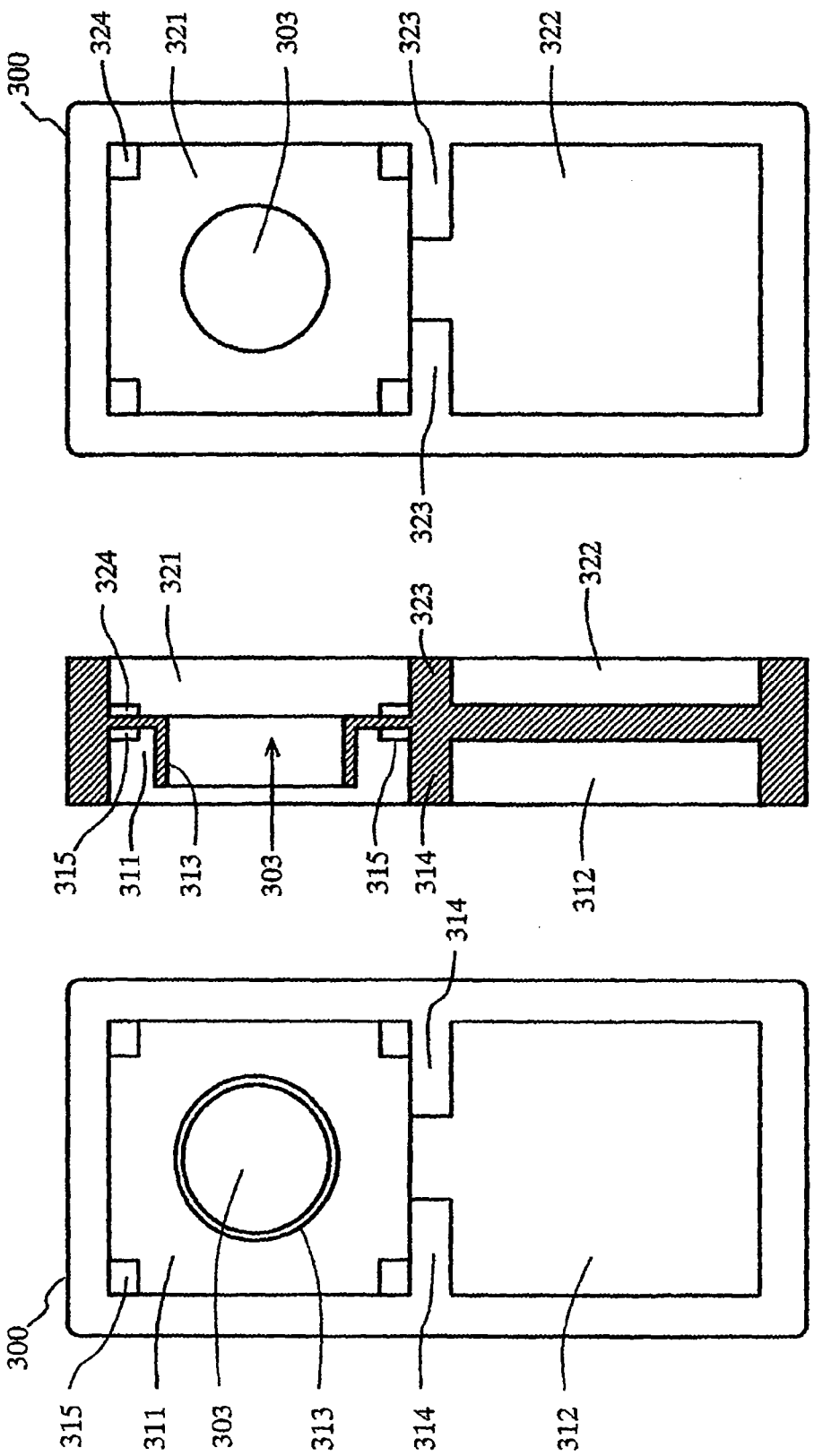

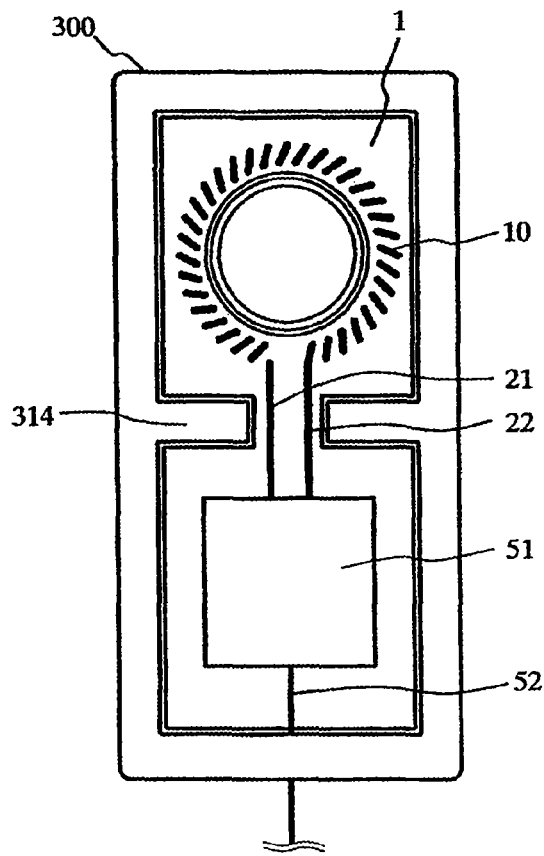
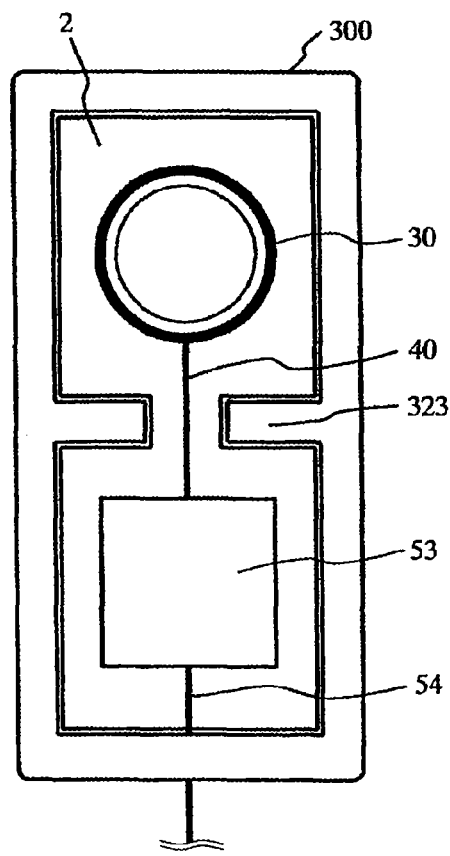
FIG. 16A   FIG. 16B
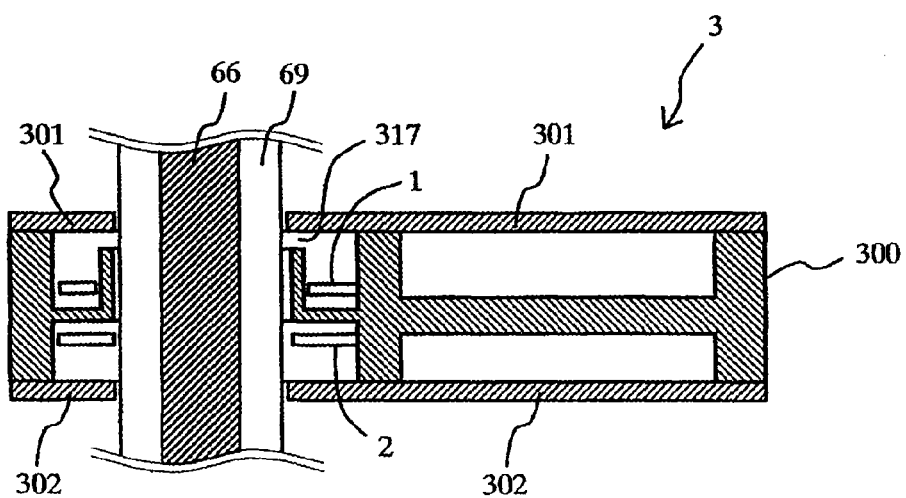
FIG. 17

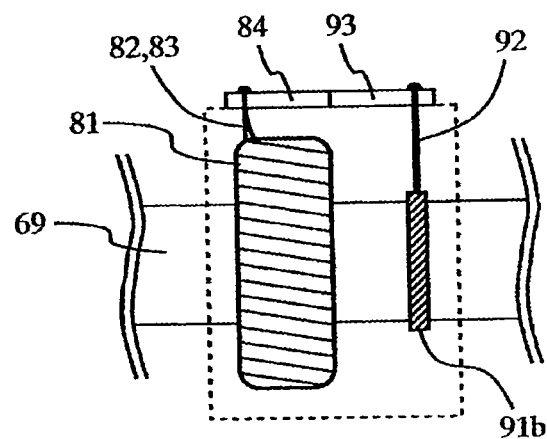
FIG. 29A
PRIOR ART
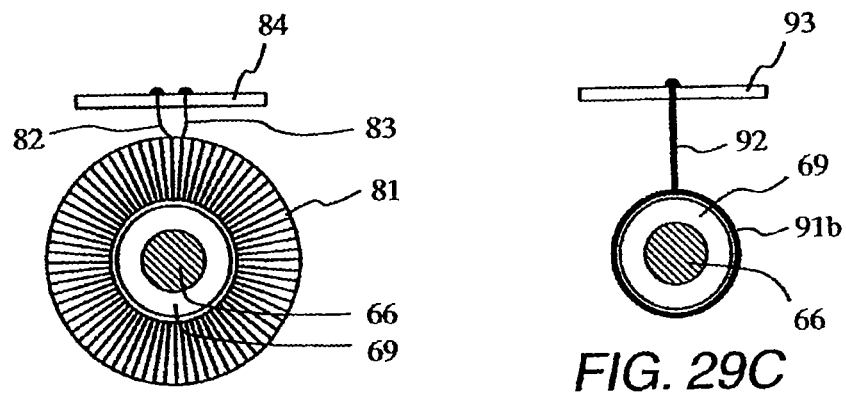
FIG. 29B
PRIOR ART
FIG. 29C
PRIOR ART

VOLTAGE DETECTOR HAVING VOLTAGE DETECTION PRINTED BOARD

This application is a continuation application of pending U.S. patent application Ser. No. 12/732,773, filed Mar. 26, 2010, which is a continuation of U.S. patent application Ser. No. 11/627,703, filed Jan. 26, 2007 (Now U.S. Pat. No. 7,714,594, issued on May 11, 2010) which claims priority under 35 USC §119 to Japanese Application No. 2006-021528, filed Jan. 30, 2006 and Japanese Application No. 2006-208966, filed Jul. 31, 2006, the disclosures of which are expressly incorporated by reference herein in their entireties.

BACKGROUND OF THE INVENTION

1. Technical Field of the Invention

The present invention relates to a current detection printed board that is used to detect an alternating current flowing in a power transmission conductor used as an alternating current (AC) power transmission path, to a voltage detection printed board that is used to detect an AC voltage to be generated in the power transmission conductor, to a current/voltage detector using the same, and to a current detector and a voltage detector. In particular, the invention relates to a technology that uses high-frequency power as AC power.

2. Description of the Related Art

Like an impedance matching device or a high-frequency power supply device, there is known a device that detects AC power current and voltage and performs a control using the detected current and voltage. As an example, an impedance matching device will now be described.

FIG. 26 is a block diagram of an example of a high-frequency power supply system that uses an impedance matching device.

The high-frequency power supply system is a system that performs a processing, such as plasma etching or plasma CVD, on a workpiece, such as a semiconductor wafer or a liquid crystal substrate. The high-frequency power supply system includes a high-frequency power supply device 61, a transmission line 62, an impedance matching device 63, a load connection portion 64, and a load 65 (plasma processing device 65).

The high-frequency power supply device 61 is a device that outputs high-frequency power to the plasma processing device 65 as a load. Moreover, high-frequency power output from the high-frequency power supply device 61 is supplied to the plasma processing device 65 through the transmission line 62 having a coaxial cable, the impedance matching device 63, and the load connection portion 64 having a shielded copper plate. In general, the high-frequency power supply device 61 outputs high-frequency power having a frequency of a radio frequency band (for example, a frequency of hundreds kHz or more).

The plasma processing device 65 is a device that performs a processing (etching or CVD) on a wafer or a liquid crystal substrate.

The impedance matching device 63 includes a matching circuit that has a variable impedance element (for example, a variable capacitor, a variable inductor, or the like) (not shown) therein. The impedance matching device 63 has a control function of changing impedance of the variable impedance element in the matching circuit to accomplish impedance matching between the high-frequency power supply device 61 and the load 65.

In order to perform the above-described control, a current detector and a voltage detector are provided between an input terminal 63*a* of the impedance matching device 63 and the matching circuit. The current detector and the voltage detector detect high-frequency current and high-frequency voltage output from the high-frequency power supply device 61. Information of forward wave power or reflected wave power is obtained using the current and voltage detected by the detectors. Then, impedance of the variable impedance element is controlled using the obtained information to accomplish impedance matching.

FIG. 27 is a schematic circuit diagram of a current detector 80 and a voltage detector 90 provided between the input terminal and a matching circuit 67 of the impedance matching device 63. As shown in FIG. 27, a power transmission conductor 66 (for example, rod-shaped copper) serving as a power transmission path is provided between the input terminal 63*a* and the matching circuit 67. Then, the current detector 80 and the voltage detector 90 are provided on the power transmission conductor 66.

The current detector 80 has a current transformer 81, output wires 82 and 83 of the current transformer 81, a current conversion circuit 84, and an output wire 85 of the current conversion circuit 84. In the current detector 80, a current according to an AC current that flows in the power transmission conductor 66 flows in the current transformer 81. This current is input to the current conversion circuit 84 through the output wires 82 and 83 and is converted into a predetermined voltage level. Then, the converted voltage is output from the output wire 85 of the current conversion circuit 84.

The voltage detector 90 has a capacitor 91, an output wire 92 of the capacitor 91, a voltage conversion circuit 93, and an output wire 94 of the voltage conversion circuit 93. In the voltage detector 90, a voltage according to an AC voltage generated in the power transmission conductor 66 is generated in the capacitor 91. This voltage is input to the voltage conversion circuit 93 through the output wire 92 and is converted into a predetermined voltage level. Then, the converted voltage is output from the output wire 94 of the voltage conversion circuit 93.

Subsequently, as described above, the information of forward wave power or reflected wave power is obtained using the current and voltage detected by the current detector 80 and the voltage detector 90. The current detector 80 and the voltage detector 90 have a structure shown in FIGS. 28 and 29.

FIG. 28 is a schematic exterior view of the current detector 80 and the voltage detector 90.

FIGS. 29A to 29C are explanatory views illustrating the configuration of the current detector 80 and the voltage detector 90 shown in FIG. 28. Specifically, FIG. 29A is a diagram showing the interior of a casing (indicated by a dotted line) of FIG. 28 in perspective view. FIG. 29B is a diagram showing the vicinity of the current transformer 81 as viewed from the transverse side of FIG. 29A. FIG. 29C is a diagram showing the vicinity of the capacitor 91 as viewed from the transverse side of FIG. 29A.

In FIGS. 28 and 29A to 29C, the power transmission conductor 66 and an insulator 69 covering the power transmission conductor 66, not included in the current detector 80 and the voltage detector 90, are shown for explanation. Further, in FIGS. 28 and 29A to 29C, for convenience, the same parts as those in FIG. 27 are represented by the same reference numerals.

Hereinafter, the current detector 80 and the voltage detector 90 will be described with reference to FIGS. 28 and 29A to 29C.

In FIGS. 28 and 29A to 29C, the power transmission conductor 66 is, for example, a cylindrical copper rod. The periphery of the power transmission conductor 66 is covered with a hollow insulator 69. Then, the power transmission conductor 66 and the insulator 69 pass through a casing 71. Further, the current transformer 81 constituting the current detector 80 and the capacitor 91 constituting the voltage detector 90 are accommodated in the casing 71.

In the current transformer 81, a coated copper wire or the like is wound around a ring-shaped magnetic core (for example, a toroidal core or a ferrite core) to form a coiled wire. Then, the current transformer 81 is disposed such that the power transmission conductor 66 passes through the magnetic core. Accordingly, a current according to a current flowing in the power transmission conductor 66 flows in the coiled wire of the current transformer 81.

The current flowing in the current transformer 81 is input to the current conversion circuit 84 through the output wires 82 and 83 that are connected to both ends of the coiled wire. Then, the current conversion circuit 84 converts the input current into a predetermined voltage level and outputs the converted voltage.

The capacitor 91 is formed by providing a ring-shaped conductor 91b (for example, a copper ring) in the vicinity of the insulator 69. The ring-shaped conductor 91b and a portion 91a facing the power transmission conductor 66 function as electrodes of the capacitor. Accordingly, a voltage according to the voltage generated in the power transmission conductor 66 is generated in the capacitor 91. The voltage generated in the capacitor 91 is input to the voltage conversion circuit 93 through the output wire 92 connected to the ring-shaped conductor 91b. Then, the voltage conversion circuit 93 converts the input voltage into a predetermined voltage level and outputs the converted voltage.

Moreover, in FIGS. 28 and 29A to 29C, the output wire 85 of the current conversion circuit 84 and the output wire 94 of the voltage conversion circuit 93 are not shown. Further, in order to protect the current conversion circuit 84 and the voltage conversion circuit 93 from an influence of an electromagnetic wave, a common conductor cover 72 is provided to cover the current conversion circuit 84 and the voltage conversion circuit 93. FIG. 28 shows a state where the cover 72 is removed, in order to show the current conversion circuit 84 and the voltage conversion circuit 93. Further, in FIGS. 29A to 29C, the cover 72 is not shown.

As described with reference to FIGS. 28 and 29A to 29C, the current detector 80 and the voltage detector 90 have the casing that covers the current transformer 81, the capacitor 91, and the like, in addition to the parts of the circuit diagram in FIG. 27. The casing is common to the current detector 80 and the voltage detector 90 according to the related art.

The current detector 80 and the voltage detector 90 described above can be used to other devices, such as the high-frequency power supply device 61 or the like. For example, in case of the high-frequency power supply device, the current detector and the voltage detector are provided at an output terminal of the high-frequency power supply device 61. In this case, the current detector and the voltage detector are used to detect current and voltage required for controlling output forward wave power to have a set value.

The current detector and the voltage detector may detect current and voltage at the output terminal 63b of the impedance matching device or the input terminal of the load 65 and may be used to control or analyze the detected current or voltage.

FIG. 30 is a circuit diagram showing a case where the current detector 80 and the voltage detector 90 are provided between the matching circuit and the output terminal in the impedance matching device.

As shown in FIG. 30, the current detector 80 and the voltage detector 90 are provided on the power transmission conductor 68 between the matching circuit 67 and the output terminal 63b in the impedance matching circuit. In this case, the current detector 80 and the voltage detector 90 detect current and voltage at the output terminal 63b of the impedance matching circuit.

In FIG. 30, the same parts as those of the circuit diagram in FIG. 27 are represented by the same reference numerals. Meanwhile, there is a difference in current and voltage at the input terminal 63a and the output terminal 63b of the impedance matching circuit. Accordingly, the current detector 80 and the voltage detector 90 have a structural difference in view of current resistance and voltage resistance. In FIG. 30, the same reference numerals are used regardless of the structural difference. For example, the output terminal 63b of the impedance matching circuit has higher current and voltage than the input terminal 63a thereof. For this reason, when the current detector 80 and the voltage detector 90 are provided at the output terminal 63b of the impedance matching circuit, it is necessary to extend an insulation length, compared with a case where the current detector 80 and the voltage detector 90 are provided at the input terminal 63a of the impedance matching circuit. In order to extend the insulation length, a conductor having a large diameter is used as the power transmission conductor 68 or the insulator 69 covering the periphery of the power transmission conductor 68 has a large thickness. In FIG. 30, however, for convenience, the structural difference is not considered.

As shown in FIG. 30, when the current detector and the voltage detector are used in the impedance matching circuit, it is necessary to additionally provide a detector for detecting information of current and voltage for impedance matching on the input side of the impedance matching circuit.

Patent Document 1: JP-A-2003-302431
Patent Document 2: JP-A-2004-85446

Since the current transformer 81 constituting the current detector 80 is formed by winding the wire around the magnetic core, a variation in wiring interval or wiring strength may easily occur. For this reason, when a plurality of current detectors 80 are formed, a variation in detection value of the individual current detectors 80 may easily occur.

Further, a variation in shape of the output wires 82 and 83 of the current transformer 81 may easily occur, which may cause a variation in current detection value.

The inner diameter of the ring-shaped conductor 91b constituting the voltage detector 90 is substantially consistent with the outer diameter of the insulator 69 covering the periphery of the power transmission conductor 66. The ring-shaped conductor 91b is fitted into the insulator 69. That is, the ring-shaped conductor 91b is positioned by the insulator 69. However, the insulator 69 may be thinned due to a secular change or the like. In this case, the position of the ring-shaped conductor 91b may be unstable, and a gap may occur between the power transmission conductor 66 and the insulator 69. In this state, if an external force acts on the power transmission conductor 66, the positional relationship between the power transmission conductor 66 and the ring-shaped conductor 91b changes. Then, a voltage detection value changes from an initial state (upon adjustment of the detector). Besides, since the position of the ring-shaped conductor 91b is unstable, when a plurality of voltage detectors 90 are formed, a variation in detection value of the individual voltage detectors 90 may easily occur.

Further, a variation in shape of the output wire 92 of the ring-shaped conductor 91b may easily occur, which may cause a variation in voltage detection value.

That is, in case of the current detector 80 or the voltage detector 90, when a plurality of detectors are formed, a variation in detection value of the individual detectors may easily occur.

Further, since the wire is wound around the core in the current transformer 81 constituting the current detector 80, there is a self-resonant frequency by self inductance and line capacitance. However, since relative magnetic permeability of a magnetic material used for the core is large, the self-resonant frequency becomes low. For this reason, an upper limit of a detectable frequency band becomes low. That is, the detectable frequency band is limited.

In case of manufacturing the impedance matching device, when the current detector 80 and the voltage detector 90 are installed in the device, it is necessary to install the power transmission conductor 66 and the like simultaneously. However, there are many cases where the impedance matching device or the like is cramped. Accordingly, it may be difficult to install the power transmission conductor 66 and the like simultaneously due to interference with other parts. In addition, when the current detector 80 and the voltage detector 90 are removed for maintenance, since it is necessary to remove the power transmission conductor 66 and the like simultaneously, it may be difficult to remove the current detector 80 and the voltage detector 90. For example, when the current detector 80 and the voltage detector 90 are disposed on the back side of the impedance matching device, it is necessary to remove the parts on the front side. At this time, in the configuration of the related art, since the volume of a portion to be removed becomes large, and thus it is necessary to remove more parts. As a result, a larger number of work steps are required.

SUMMARY OF THE INVENTION

An object of the invention is to provide a current transformer and a capacitor that can reduce a variation in current detection value or voltage detection value of individual detectors even though a plurality of detectors. Another object of the invention is to provide a current/voltage detector, and a current detector and a voltage detector that use the current transformer and the capacitor. Still another object of the invention is to improve maintenance.

According to a first aspect of the invention, there is provided a current detection printed board comprising: a board having a penetration hole that penetrates the board; and at least one wire that is formed in a coiled shape having both ends by penetrating the board along the periphery of the penetration hole and alternately connecting a front surface layer and a rear surface layer of the board, wherein, when a conductor, in which an AC current flows, is disposed to pass through the inside of the penetration hole, a current flowing in the wire is output through electromagnetic induction.

According to a second aspect of the invention, the wire may include: through holes formed at the penetrating portion of the board; and pattern wires formed on the front surface layer and the rear surface layer.

According to a third aspect of the invention, wherein, when a plurality of the wires are formed in the board, both ends or electrically identical portions of each wire may be electrically connectable to both ends or electrically identical positions of another wire.

According to a fourth aspect of the invention, there is provided a current detection printed board comprising: a board having a penetration hole that penetrates the board; and at least one wire that is formed in a coiled shape and has both ends by penetrating between a top conductive layer and a bottom conductive layer of the board along the periphery of the penetration hole and alternately connecting the top conductive layer and the bottom conductive layer of the board, and/or at least one wire that is formed in a coiled shape and has both ends by penetrating a part of layers of the board and alternately connecting a top conductive layer and a bottom conductive layer of the penetrating portion, wherein, when a conductor, in which an AC current flows, is disposed to pass through the inside of the penetration hole, a current flowing in the wire is output through electromagnetic induction.

According to a fifth aspect of the invention, the wire may include: through holes formed at the penetrating portion penetrating between the top conductive layer and the bottom conductive layer of the board or the part of layers of the board; and pattern wires formed on the top conductive layer and the bottom conductive layer of the penetrating portion.

According to a sixth aspect of the invention, when a plurality of the wires are formed in the board, both ends or electrically identical portions of each wire may be electrically connectable to both ends or electrically identical positions of another wire.

According to a seventh aspect of the invention, wherein the penetration hole may have a circular shape, and the wire may be formed in a circular shape along the periphery of the penetration hole.

According to an eighth aspect of the invention, wherein the AC current may be an AC current having a frequency of a radio frequency band.

According to a ninth aspect of the invention, there is provided a voltage detection printed board comprising: a board having a penetration hole that penetrates the board; and a wire that is formed along the periphery of the penetration hole, wherein, when a conductor, in which an AC voltage is generated, is disposed to pass through the penetration hole, the wire functions as an electrode of a capacitor by making a pair with a portion of the conductor facing the wire.

According to a tenth aspect of the invention, the wire may include: along the periphery of the penetration hole, a plurality of through holes penetrating the board; and pattern wires formed on a top conductive layer and a bottom conductive layer of the board so as to connect the through holes.

According to an eleventh aspect of the invention, the wire may include: along the periphery of the penetration hole, a plurality of through holes penetrating between the top conductive layer and the bottom conductive layer of the board or a part of layers of the board; and a pattern wire formed on at least one layer between the top conductive layer and the bottom conductive layer of the penetrating portion so as to connect the through holes.

According to a twelfth aspect of the invention, the through holes may have a circular shape, and the wire may be formed in a circular shape along the periphery of the penetration hole.

According to a thirteenth aspect of the invention, the AC voltage may be an AC voltage having a frequency of a radio frequency band.

According to a fourteenth aspect of the invention, there is provided a current/voltage detector that detects an AC current flowing in a power transmission conductor to be used as an AC power transmission path and an AC voltage generated in the power transmission conductor, the current/voltage detector comprising: a current detection printed board having a first penetration hole that penetrates the board, and including: at least one first wire that is formed in a coiled shape and has both ends by penetrating the board along the periphery of the first penetration hole and alternately connecting a front surface layer and a rear surface layer of the board; and a second wire for output that is connected to all or a part of both ends of the first wire, wherein when the power transmission conductor, in which an AC current flows, is disposed to pass through the first penetration hole, a current flowing in the first wire is output through electromagnetic induction; and a voltage detection printed board having a second penetration hole that penetrates the board, and including: a third wire that is formed along the periphery of the second penetration hole; and a fourth wire for output that is connected to a part of the third wire, wherein when the power transmission conductor, in which an AC voltage is generated, is disposed to pass through the second penetration hole, the third wire makes a pair with a portion of the power transmission conductor facing the third wire and functions as an electrode of a capacitor, and a voltage generated in the third wire is output from the fourth wire.

According to a fifteenth aspect of the invention, the first wire may include: through holes formed at the penetrating portion of the board; and pattern wires formed on the front surface layer and the rear surface layer.

According to a sixteenth aspect of the invention, the third wire may include: along the periphery of the second penetration hole, a plurality of through holes penetrating the board; and pattern wires formed on the front surface layer and the rear surface layer of the board to connect the through holes.

According to a seventeenth aspect of the invention, there is provided a current/voltage detector that detects an AC current flowing in a power transmission conductor to be used as an AC power transmission path and an AC voltage generated in the power transmission conductor, the current/voltage detector comprising: a current detection printed board having a first penetration hole that penetrates the board, and including: at least one first wire that is formed in a coiled shape and has both ends by penetrating between a top conductive layer and a bottom conductive layer of the board along the periphery of the first penetration hole and alternately connecting the top conductive layer and the bottom conductive layer of the board, and/or at least one wire that is formed in a coiled shape and has both ends by penetrating a part of layers of the board and alternately connecting a top conductive layer and a bottom conductive layer of the penetrating portion, and a second wire for output that is connected to all or a part of both ends of the first wire, wherein when the power transmission conductor, in which an AC current flows, is disposed to pass through the first penetration hole, a current flowing in the first wire is output through electromagnetic induction; and a voltage detection printed board having a second penetration hole that penetrates the board, and including: a third wire that is formed along the periphery of the second penetration hole; and a fourth wire for output that is connected to a part of the third wire, wherein when the power transmission conductor, in which an AC voltage is generated, is disposed to pass through the second penetration hole, the third wire makes a pair with a portion of the power transmission conductor facing the third wire and functions as an electrode of a capacitor, and a voltage generated in the third wire is output from the fourth wire.

According to an eighteenth aspect of the invention, the first wire may include: through holes formed at the penetrating portion penetrating between the top conductive layer and the bottom conductive layer of the board or the part of layers of the board; and pattern wires formed on the top conductive layer and the bottom conductive layer of the penetrating portion.

According to a nineteenth aspect of the invention, the third wire may include: along the periphery of the penetration hole, a plurality of through holes penetrating between the top conductive layer and the bottom conductive layer of the board or a part of layers of the board; and a pattern wire formed on at least one layer between the top conductive layer and the bottom conductive layer of the penetrating portion so as to connect the through holes.

According to a twentieth aspect of the invention, when a plurality of the first wires are formed in the board, both ends or electrically identical portions of each wire may be electrically connectable to both ends or electrically identical positions of another wire.

According to a twenty-first aspect of the invention, the first penetration hole provided in the current detection printed board and the second penetration hole provided in the voltage detection printed board may be substantially coaxially located.

According to a twenty-second aspect of the invention, the current/voltage detector may further comprise: a first conversion circuit that converts the current output from the second wire of the current detection printed board into a predetermined voltage level; a fifth wire that outputs the voltage converted by the first conversion circuit; a second conversion circuit that converts the voltage output from the fourth wire of the voltage detection printed board into a predetermined voltage level; and a sixth wire that outputs the voltage converted by the second conversion circuit.

According to a twenty-third aspect of the invention, the first conversion circuit may be provided on the current detection printed board, and the second conversion circuit may be provided on the voltage detection printed board.

According to a twenty-fourth aspect of the invention, the current/voltage detector may further comprises: a conductor casing that fixes the current detection printed board and the voltage detection printed board therein, wherein the casing may have: on an axis passing through the first penetration hole provided in the current detection printed board and the second penetration hole provided in the voltage detection printed board, a penetration hole through which the power transmission conductor passes; an opening through which a magnetic flux acting on the first wire passes; an opening that allows the third wire and the power transmission conductor to be not shielded; an opening through which the fifth wire is led to the outside; and an opening through which the sixth wire is led to the outside, and wherein the casing may be configured to cover the current detection printed board and the voltage detection printed board, excluding the openings.

According to a twenty-fifth aspect of the invention, the casing may include: a first casing that fixes the current detection printed board; a second casing that fixes the voltage detection printed board; a first cover that covers the first casing; and a second cover that covers the second casing, and the first casing and the second casing are disposed such that both sides thereof overlap each other.

According to a twenty-sixth aspect of the invention, a shield member that reduces the amount of an electromagnetic wave entering from a side of the first wire into a side of the first conversion circuit may be provided in at least one of the first casing and the first cover.

According to a twenty-seventh aspect of the invention, a shield member that reduces the amount of an electromagnetic wave entering from a side of the third wire into a side of the second conversion circuit may be provided in at least one of the second casing and the second cover.

According to a twenty-eighth aspect of the invention, the first casing and the second casing may be formed in a single body.

According to a twenty-ninth aspect of the invention, the casing may include a fixing unit that substantially fixes the relative position between the power transmission conductor, and the current detection printed board and the voltage detection printed board.

According to a thirtieth aspect of the invention, the AC power may be AC power having a frequency of a radio frequency band.

According to a thirty-first aspect of the invention, there is provided a current detector that detects an AC current flowing in a power transmission conductor to be used as an AC power transmission path, the current detector comprising: a current detection printed board having a first penetration hole that penetrates the board, and including: at least one first wire that is formed in a coiled shape and has both ends by penetrating the board along the periphery of the first penetration hole and alternately connecting a front surface layer and a rear surface layer of the board, and a second wire for output that is connected to all or a part of both ends of the first wire, wherein when the power transmission conductor, in which an AC current flows, is disposed to pass through the first penetration hole, a current flowing in the first wire is output through electromagnetic induction.

According to a thirty-second aspect of the invention, there is provided a current detector that detects an AC current flowing in a power transmission conductor to be used as an AC power transmission path, the current detector comprising: a current detection printed board having a first penetration hole that penetrates the board, and including: at least one first wire that is formed in a coiled shape and has both ends by penetrating between a top conductive layer and a bottom conductive layer of the board along the periphery of the penetration hole and alternately connecting the top conductive layer and the bottom conductive layer of the board, and/or at least one first wire that is formed in a coiled shape and has both ends by penetrating a part of layers of the board and alternately connecting a top conductive layer and a bottom conductive layer of the penetrating portion; and a second wire for output that is connected to all or a part of both ends of the first wire, wherein when the power transmission conductor, in which an AC current flows, is disposed to pass through the first penetration hole, and a current flowing in the first wire is output through electromagnetic induction.

According to a thirty-third aspect of the invention, the current detector may further comprise: a first conversion circuit that converts the current output from the second wire of the current detection printed board into a predetermined voltage level; and a third wire that outputs the voltage converted by the first conversion circuit.

According to a thirty-fourth aspect of the invention, the first conversion circuit may be provided on the current detection printed board.

According to a thirty-fifth aspect of the invention, the current detector may further comprise: a conductor casing that fixes the current detection printed board therein, wherein the casing has: on an axis passing through the first penetration hole provided in the current detection printed board; a penetration hole through which the power transmission conductor passes; an opening through which a magnetic flux acting on the first wire passes; and an opening through which a third wire is led to the outside, and wherein the casing is configured to cover the current detection printed board, excluding the openings.

According to a thirty-sixth aspect of the invention, the casing may include: a first casing that fixes the current detection printed board; and a first cover that covers the first casing.

According to a thirty-seventh aspect of the invention, a shield member that reduces the amount of an electromagnetic wave entering from the first wire into the first conversion circuit may be provided in at least one of the first casing and the first cover.

According to a thirty-eighth aspect of the invention, the casing may include a fixing unit that substantially fixes the relative position between the power transmission conductor and the current detection printed board.

According to a thirty-ninth aspect of the invention, the AC power may be AC power having a frequency of a radio frequency band.

According to a fortieth aspect of the invention, there is provided a voltage detector that detects an AC voltage generated in a power transmission conductor to be used as an AC power transmission path, the voltage detector comprising: a voltage detection printed board having a first penetration hole that penetrates the board, and including a first wire that is formed along the periphery of the first penetration hole, and a second wire for output that is connected to a part of the first wire, wherein when the power transmission conductor, in which an AC voltage is generated, is disposed to pass through the first penetration hole, the first wire functions as an electrode of a capacitor by making a pair with a portion of the power transmission conductor facing the first wire, and a voltage generated in the first wire is output from the second wire.

According to a forty-first aspect of the invention, the voltage detector may further comprise a first conversion circuit that converts the voltage output from the second wire of the voltage detection printed board into a predetermined voltage level; and a third wire that output the voltage converted by the first conversion circuit.

According to a forty-second aspect of the invention, the first conversion circuit may be provided on the voltage detection printed board.

According to a forty-third aspect of the invention, the voltage detector may further comprise a conductor casing that fixes the voltage detection printed board therein, wherein the casing may have: on an axis passing through the first penetration hole provided in the voltage detection printed board; a penetration hole through which the power transmission conductor passes; an opening that allows the first wire and the power transmission conductor to be not shielded, and an opening through which the third wire is led to the outside; and the casing may be configured to cover the voltage detection printed board, excluding the openings.

According to a forty-fourth aspect of the invention, the casing may include: a first casing that fixes the voltage detection printed board; and a first cover that covers the second casing.

According to a forty-fifth aspect of the invention, a shield member that reduces the amount of an electromagnetic wave entering from a side of the first wire into a side of the first conversion circuit may be provided in at least one of the first casing and the first cover.

According to a forty-sixth aspect of the invention, the casing may include a fixing unit that substantially fixes the relative position between the power transmission conductor and the voltage detection printed board.

According to a forty-seventh aspect of the invention, wherein the AC power may be AC power having a frequency of a radio frequency band.

According to the first and fourth aspects of the invention, since the coiled wire is formed in the printed board, the printed board can have a function of a current transformer.

According to the second and fifth aspects of the invention, since the through holes and pattern wires form the coiled wire, unlike the related art, there is no case where a self-resonant frequency or a degree of coupling of the current transformer changes due to a variation in winding internal or winding strength. For this reason, when a plurality of current detection printed boards are formed, a variation in current detection value of the individual current detection printed boards can be reduced.

According to the seventh aspect of the invention, when the conductor, in which the AC current flows, is disposed to pass through the penetration hole, a cylindrical (a circular shape in section) conductor is preferably used as the conductor. Further, since a magnetic flux is generated around the conductor, the magnetic flux can efficiently pass through the wire having the coiled shape.

Like the eighth aspect of the invention, in case of an AC current having a frequency of a radio frequency band, a variation in winding interval or winding strength may have a large effect on the current detection value. However, according to the current detection printed board having the configuration of the invention, even though an AC current having a frequency of a radio frequency band is adopted, an influence thereof can be suppressed to the minimum.

According to the ninth aspect of the invention, the wire that is formed along the penetration hole provided in the board functions as an electrode of the capacitor. Therefore, the printed board can have a voltage detection function.

According to the tenth and eleventh aspects of the invention, with the through holes and the pattern wires, a ring-shaped wire that functions as an electrode of the capacitor can be formed in the printed board. Therefore, when a plurality of voltage detection printed boards are formed, a variation in voltage detection value of the individual voltage detection printed boards can be reduced.

Further, the wire has a feature in that the through holes are utilized, as well as the pattern wires. That is, only with the pattern wires, the ring-shaped wire does not have a thickness enough to functioning as an electrode of the capacitor. For this reason, with the through holes, the thickness of the ring-shaped wire can be made large.

According to the twelfth aspect of the invention, when the conductor, in which the AC voltage is generated, is disposed to pass through the penetration hole, a cylindrical (a circular shape in section) conductor is preferably used as the conductor. Further, in case of the circular shape, an inter-electrode distance of the capacitor is likely to be kept constant, and a variation in detection value can be reduced.

Like the thirteenth aspect of the invention, in case of an AC voltage having a frequency of a radio frequency band, a structural variation may have a large effect on the voltage detection value. However, according to the voltage detection printed board having the configuration of the invention, even though an AC voltage having a frequency of a radio frequency band is adopted, an influence thereof can be suppressed to the minimum.

According to the fourteenth and seventeenth aspects of the invention, current detection can be performed by the current detection printed board, and voltage detection can be performed by the voltage detection printed board. Further, according to the thirty-first and thirty-second aspects of the invention, current detection can be performed by the current detection printed board. In addition, according to the fortieth aspect of the invention, voltage detection can be performed by the voltage detection printed board.

According to the twenty-first aspect of the invention, at least portions of the power transmission conductor penetrating the current/voltage detector can be formed in a linear shape (for example, a cylindrical shape). That is, since it is necessary to form the power transmission conductor in a complex shape, manufacturing of the power transmission conductor can be simplified.

According to the twenty-third aspect of the invention, the second wire and the fourth wire can be formed by pattern wires (as occasion demands, including through holes). Accordingly, a variation in detection value due to a variation in shape of the wire or the like can be reduced. Further, the number of assembling steps can be reduced.

Further, the effects of the thirty-fourth aspect of the invention are the same as the effects about the second wire. In addition, the effects of the forty-second aspect of the invention are the same as the effects about the fourth wire.

According to the twenty-fourth aspect of the invention, the printed boards are shielded, excluding the openings required for the current detection printed board and openings required for the voltage detection printed board. Therefore, an influence of an electromagnetic wave on the printed boards can be reduced as small as possible.

Further, the effects of the thirty-fifth aspect of the invention are the same as the effects about the current detection printed board. In addition, the effects of the forty-third aspect of the invention are the same as the effects about the voltage detection printed board.

According to the twenty-sixth aspect of the invention, an influence of an electromagnetic wave on the first conversion circuit can be reduced as small as possible. Further, the effects of the thirty-seventh aspect of the invention are the same as the above-described effects.

According to the twenty-seventh aspect of the invention, an influence of an electromagnetic wave on the second conversion circuit can be reduced as small as possible. Further, the effects of the forty-fifth aspect of the invention are the same as the above-described effects.

According to the twenty-eighth aspect of the invention, for example, the first casing and the second casing are formed in a signal body such that the first penetration hole provided in the current detection printed board and the second penetration hole provided in the voltage detection printed board are substantially coaxially located. Therefore, the number of steps of substantially coaxially locating the first penetration hole and the second penetration hole can be removed.

According to the twenty-ninth aspect of the invention, the relative position between the power transmission conductor, and the current detection printed board and the voltage detection printed board can be kept substantially constant. Further, according to the thirty-eighth aspect of the invention, the relative position between the power transmission conductor and the current detection printed board can be kept substantially constant. In addition, according to the forty-sixth aspect of the invention, the relative position between the power transmission conductor and the voltage detection printed board can be kept substantially constant.

Like the thirtieth aspect of the invention, in case of an AC power having a frequency of a radio frequency band, a variation in winding interval or winding strength has a large effect on the current detection value. Further, a structural variation has a large effect on the voltage detection value. However, according to the current/voltage detector having the configuration of the invention, even though an AC power having a frequency of a radio frequency band is adopted, an influence thereof can be suppressed to the minimum.

Further, the effects of the thirty-ninth aspect of the invention are the same as the effects about current detection. In addition, the effects of the forty-seventh aspect of the invention are the same as the effects about voltage detection.

BRIEF DESCRIPTION OF THE DRAWINGS

FIGS. 3A to 3E are diagrams showing another example of the current detection printed board 1 according to the invention.

FIGS. 9A to 9D are diagrams showing an example of a voltage detection printed board 2 according to the invention.

FIGS. 10A to 10E are diagrams showing another example of the voltage detection printed board 2 according to the invention.

FIGS. 12A to 12C are schematic exterior views of a current/voltage detector 3 according to a third embodiment of the invention.

FIGS. 13A and 13B are diagrams showing the schematic configuration of the current/voltage detector 3 shown in FIGS. 12A to 12C.

FIGS. 14A to 14C are diagrams of a casing main body 300.

FIGS. 16A and 6B are diagrams when the current detection printed board 1 and the voltage detection printed board 2 are mounted on the casing main body 300 in a state where a current detector cover 301 and a voltage detector cover 302 are not mounted.

FIG. 17 is a cross-sectional view showing a case where the power transmission conductor 66 and the insulator 69 covering the power transmission conductor 66 penetrate the current/voltage detector 3.

FIGS. 29A to 29C are explanatory views illustrating the configuration of the current detector 80 and the voltage detector 90 shown in FIG. 28.

DETAILED DESCRIPTION OF THE INVENTION

Figure 1:
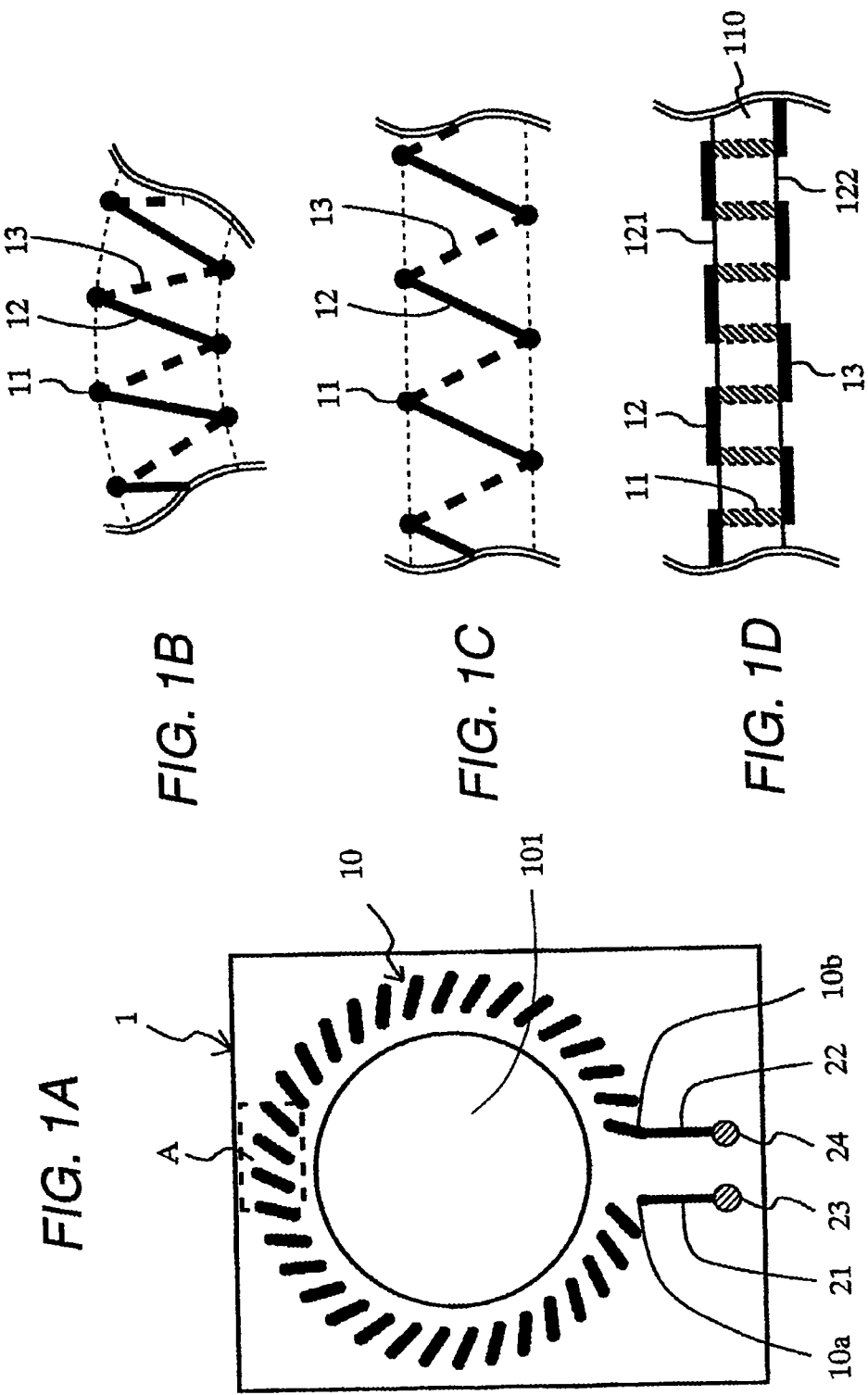
FIGS. 1A to 1D are diagrams showing an example of a current detection printed board 1 according to the invention.

Hereinafter, the details of the invention will be described with reference to the drawings.

(1) Current Detection Printed Board

FIGS. 1A to 1D are diagrams showing an example of a current detection printed board 1 according to the invention.

Specifically, FIG. 1A is a plan view of the current detection printed board 1 (as viewed from the above). FIG. 1B is a schematic view of a portion (a portion A surrounded by a dotted line) of FIG. 1A on magnified scale. FIG. 1C is a diagram showing linear expansion for simplification of FIG. 1B. FIG. 1D shows a wire of the current detection printed board 1 when FIG. 1C is viewed from the side. Moreover, as regards the wire shown in FIG. 1D, portions that are not typically viewed are shown in perspective view for explanation.

As shown in FIGS. 1A to 1D, the current detection printed board 1 is provided with a penetration hole 101 that penetrates a board. A wire 10 (hereinafter, referred to as a coiled wire 10) that is formed in a coiled shape is provided along the periphery of the penetration hole 101. The coiled wire 10 is formed in a coiled shape having both ends by alternately connecting a front surface 121 and a rear surface 122 of the board while penetrating the board. Portions of the wire penetrating the board are formed by through holes 11 and wires of the front surface and the rear surface of the board are formed by pattern wires 12 and 13.

Moreover, in FIGS. 1B and 1C, portions indicated by dotted lines represent pattern wires of the rear surface of the board. These portions are in perspective view, and thus indicated by dotted lines. Output wires 21 and 22 are connected to both ends 10a and 10b of the coiled wire 10. The output wires are connected to output terminals 23 and 24.

In this example, the board having a double-sided structure (hereinafter, referred to a double-sided board) is used. Accordingly, the pattern wires are formed on a front surface layer and a rear surface layer of one insulator member 110.

The coiled wire 10 is an example of a coiled first wire of the invention, and the output wires 21 and 22 are examples of the second wire of the invention.

Figure 2:
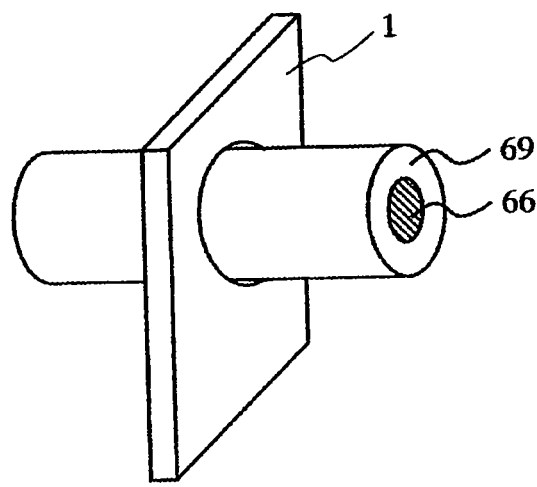
FIG. 2 is a diagram showing a case where a power transmission conductor 66, in which an AC current flows, and an insulator 69 covering the power transmission conductor 66 are disposed to pass through a penetration hole 101 provided in the current detection printed board 1.

FIG. 2 is a diagram showing a case where a power transmission conductor 66, in which an AC current flows, and an insulator 69 covering the power transmission conductor 66 are disposed to pass through the penetration hole 101 provided in the current detection printed board 1. Moreover, for simplification, the wire is not shown. Further, in this embodiment and the following embodiments, a case where the current detection printed board or a voltage detection printed board described below is provided between an input terminal and a matching circuit 67 of an impedance matching device 63.

In case of the current detection printed board 1 shown in FIG. 1, as shown in FIG. 2, when the power transmission conductor 66, in which an AC current flows, is disposed to pass through the penetration hole 101, a current flows in the coiled wire 10 by electromagnetic induction. That is, the printed board can have a current transformer. Specifically, a current transformer can be formed in the current detection printed board 1.

Figure 27:
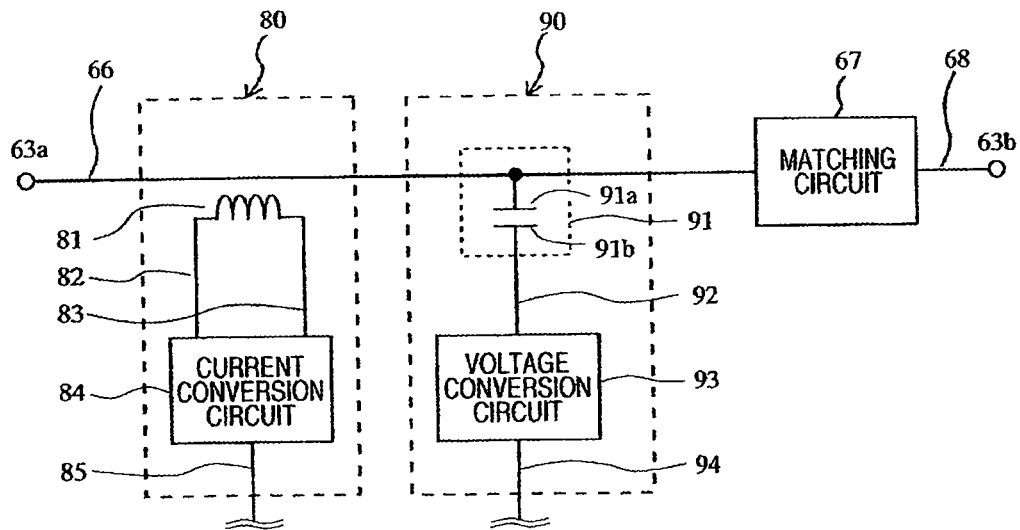
FIG. 27 is a schematic circuit diagram of a current detector 80 and a voltage detector 90 provided between an input terminal and a matching circuit 67 of an impedance matching device 63.
Figure 28:
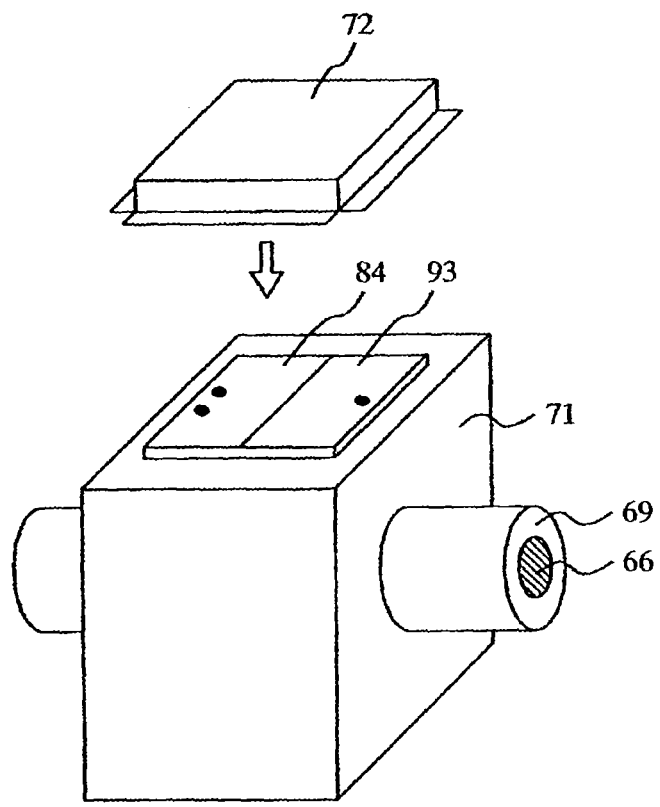
FIG. 28 is a schematic exterior view of the current detector 80 and the voltage detector 90.
Figure 30:
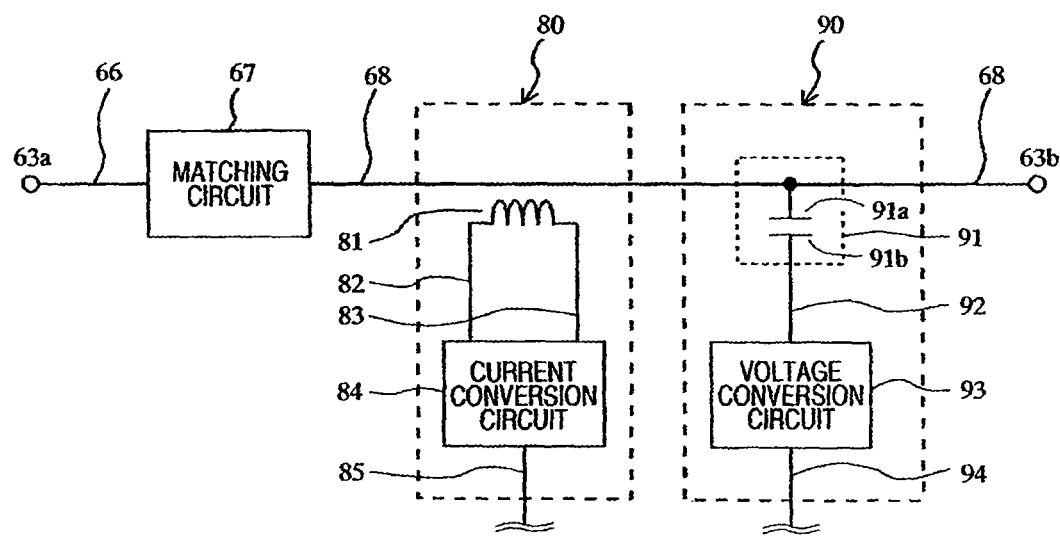
FIG. 30 is a circuit diagram showing a case where the current detector 80 and the voltage detector 90 are provided between the matching circuit and the output terminal in the impedance matching device.

Accordingly, the portions of the coiled wire 10 correspond to the current transformer 81 in the circuit diagram shown in FIG. 27.

With this configuration, the portions of the coiled wire 10 are formed by the through holes and the pattern wires, and thus there is almost no variation in shape or position. Accordingly, there is almost no variation in winding interval or winding strength. Therefore, when a plurality of current detection printed boards 1 are formed, a variation in current detection value of the individual current detection printed boards 1 can be reduced.

As described below, a current conversion circuit 51 corresponding to the current conversion circuit 84 shown in FIG. 27 may be provided on the current detection printed board 1 of FIG. 1. In this case, the output terminals 23 and 24 shown in FIG. 1 are not required, and the output wires 21 and 22 of the coiled wire 10 are directly connected to the current conversion circuit 51.

The insulator member 110 of the board is formed of, for example, glass epoxy. Relative magnetic permeability of the insulator member 110 of the board is smaller than a magnetic material. For this reason, a self-resonant frequency may be higher, compared with a case where a current transformer is formed by winding a wire around a magnetic material uses as a core, like the related art. Accordingly, an upper limit of a detectable frequency band is higher than the related art.

FIGS. 3A to 3E are diagrams showing another example of the current detection printed board 1 according to the invention.

Specifically, FIG. 3A is a plan view of the current detection printed board 1. FIG. 3B is a schematic view of a portion (a portion B surrounded by a dotted line) of FIG. 3A on magnified scale. FIG. 3C is a diagram showing linear expansion for simplification of FIG. 3B. FIG. 3D shows a wire of the current detection printed board 1 when FIG. 3C is viewed from the side. FIG. 3E shows the wire of the current detection printed board 1 paying emphasis on the output wire 21 as viewed from the side. Moreover, as regards the wire shown in FIGS. 3A to 3E, portions that are not typically viewed are shown in perspective view for explanation. In addition, for convenience, the current detection printed board 1, through holes 11, pattern wires 12 and 13, and the like are represented by the same reference numerals as those in FIGS. 1A to 1D.

The current detection printed board 1 shown in FIGS. 3A to 3E is specifically the same as the current detection printed board 1 shown in FIGS. 1A to 1D, except that the board has a multilayer structure, and the coiled wire 10 is formed between inner layers.

Moreover, in this specification, insulator materials constituting the board having a multilayer structure (hereinafter, referred to as a multilayer board) are appropriately called a first insulator material, a second insulator material, a third insulator material, . . . in sequence from the upper portion of the drawings. Further, conductive layers to be formed between the individual insulator materials of the board are appropriately called a first conductive layer, a second conductive layer, a third conductive layer, . . . . Further, a conductive layer to be formed at the front surface of the board is called a front surface layer, and a conductive layer to be formed at the rear surface of the board is called a rear surface layer.

Moreover, although the double-sided board has the front surface layer and the rear surface layer and may be called a multilayer board, since only one insulator material exists, there are no conductive layers to be formed between the individual insulator materials of the board.

In the example of FIGS. 3A to 3E, the insulator materials of the board include three insulator materials of a first insulator material 111, a second insulator 112, and a third insulator material 113. Then, a first conductive layer 131 is formed between the first insulator material 111 and the second insulator material 112, and a second conductive layer 132 is formed between the second insulator material 112 and the third insulator material 113. Further, a front surface layer can be formed on a front surface 121 (a surface on the first insulator material) of the board. In addition, a rear surface layer can be formed on a rear surface 122 (a lower surface of the third insulator material). In the example of FIGS. 3A to 3E, the rear surface layer of the board is not provided.

For this reason, in FIGS. 3A to 3E, the coiled wire 10 is formed between the first conductive layer 131 and the second conductive layer 132. Accordingly, the coiled wire 10 can have a structure that cannot be viewed from the outside of the board. In this case, portions of the coiled wire 10 correspond to the current transformer 81 of the circuit diagram shown in FIG. 27.

Further, as shown in FIG. 3E, the output wire 21 of the coiled wire 10 is formed by a pattern wire 21a connected to one end 10a of the coiled wire 10 formed in the first conductive layer 131, a through hole 21b, and a pattern wire 21C formed on the front surface of the board. The output wire 21 is connected to the output terminal 23. The output wire 22 of the coiled wire 10 is the same as the output wire 21, and thus the description thereof will be omitted.

Moreover, as described below, the current conversion circuit 51 corresponding to the current conversion circuit 84 shown in FIG. 27 may be formed on thee current detection printed board 1 of FIGS. 3A to 3E. In this case, the output terminals 23 and 24 shown in FIGS. 3A to 3E are not required, and thus the output wires 21 and 22 of the coiled wire 10 are directly connected to thee current conversion circuit 51.

Figure 4A:
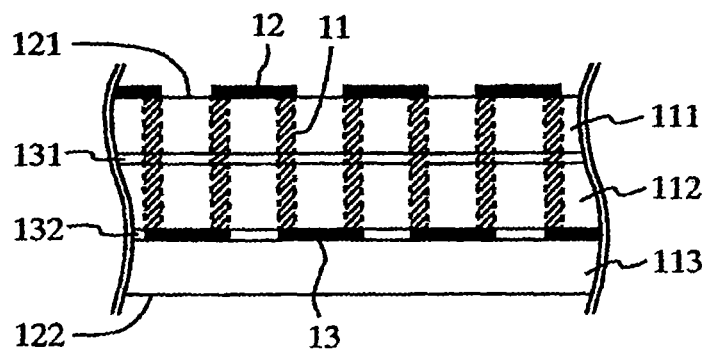
FIGS. 4A and 4B are diagram showing another example of a coiled wire 10.
Figure 4B:
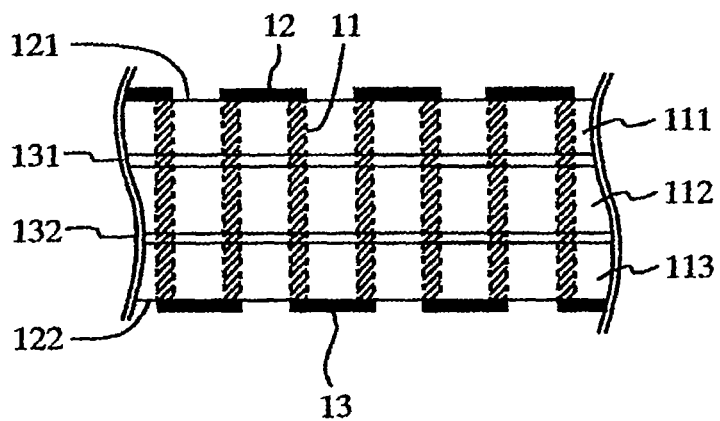

FIGS. 4A and 4B are diagram showing another example of the coiled wire 10. For example, as shown in FIG. 4A, the coiled wire 10 may be formed between the front surface layer of the board and the second conductive layer 132. Moreover, in FIG. 4A, since the rear surface layer is not provided on the rear surface 122 of the board, the coiled wire 10 is formed by alternately connecting the front surface layer as a top conductive layer of the board and the second conductive layer 132 as a bottom conductive layer of the board.

Further, as shown in FIG. 4B, the coiled wire 10 may be formed between the front surface layer as a top conductive layer and the rear surface layer as a bottom conductive layer of the board. Moreover, in FIG. 4B, like FIGS. 1A to 1D, the coiled wire 10 is formed by alternately connecting the front surface layer and the rear surface layer of the board.

In general, a through hole is one for connection between layers by forming a penetration hole between the layers of the board and providing a conductive layer (for example, copper) in the penetration hole. Moreover, the term 'between the layers' may mean 'between all layers' or 'between some layers'.

The through hole is a type of inserting a lead line. However, the through hole only for connection between the layers is particularly called a via hole. Then, the via hole includes a penetration via hole that forms a penetration hole from the front surface of the board to the rear surface thereof, and an interstitial via hole that forms a penetration hole only between specific layers. Further, the interstitial via hole includes a blind via in which a hole is viewed from one surface of the board, as shown in FIG. 4A, and a buried via in which a hole is not viewed from both surfaces of the board, as shown in FIGS. 3A to 3E.

The example shown in FIGS. 3A to 3E and 4 uses a so-called four-layered board (four conductive layers including the front surface layer and the rear surface layer), but is not intended to limit the invention. For example, a multilayer board, such as a three-layered board, a six-layered board, or an eight-layered board, may be used.

Figure 5:
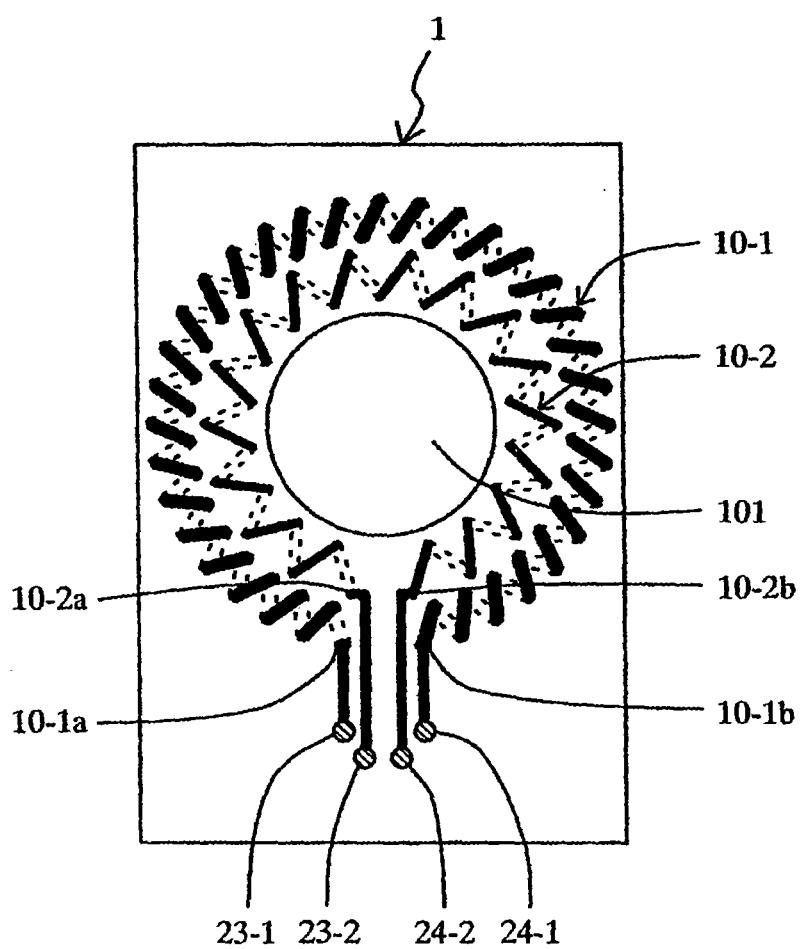
FIG. 5 is diagram showing another example of the current detection printed board 1 according to the invention.

FIG. 5 is diagram showing another example of the current detection printed board 1 according to the invention. The current detection printed board 1 shown in FIG. 5 is different from that of FIG. 1 in that two coiled wires 10-1 and 10-2 are provided in the current detection printed board 1. Specifically, a first coiled wire 10-1 that is disposed near the outside of the current detection printed board 1 and a second coiled wire 10-2 that is disposed closer to the penetration hole 101 than the first coiled wire 10-1 does are provided in the current detection printed board 1. Further, the first coiled wire 10-1 and the second coiled wire 10-2 are formed by through holes and pattern wires, like FIGS. 1B and 1C. For this reason, the descriptions thereof will be omitted. Of course, the multilayer board shown in FIGS. 3A to 3E may be used. Here, the description thereof will be omitted.

As described above, in the current detection printed board 1 shown in FIG. 5, since the two coiled wires 10-1 and 10-2 are provided, various kinds of current transformers can be formed in one current detection printed board 1. This example will be described with reference to FIG. 6.

Figure 6:
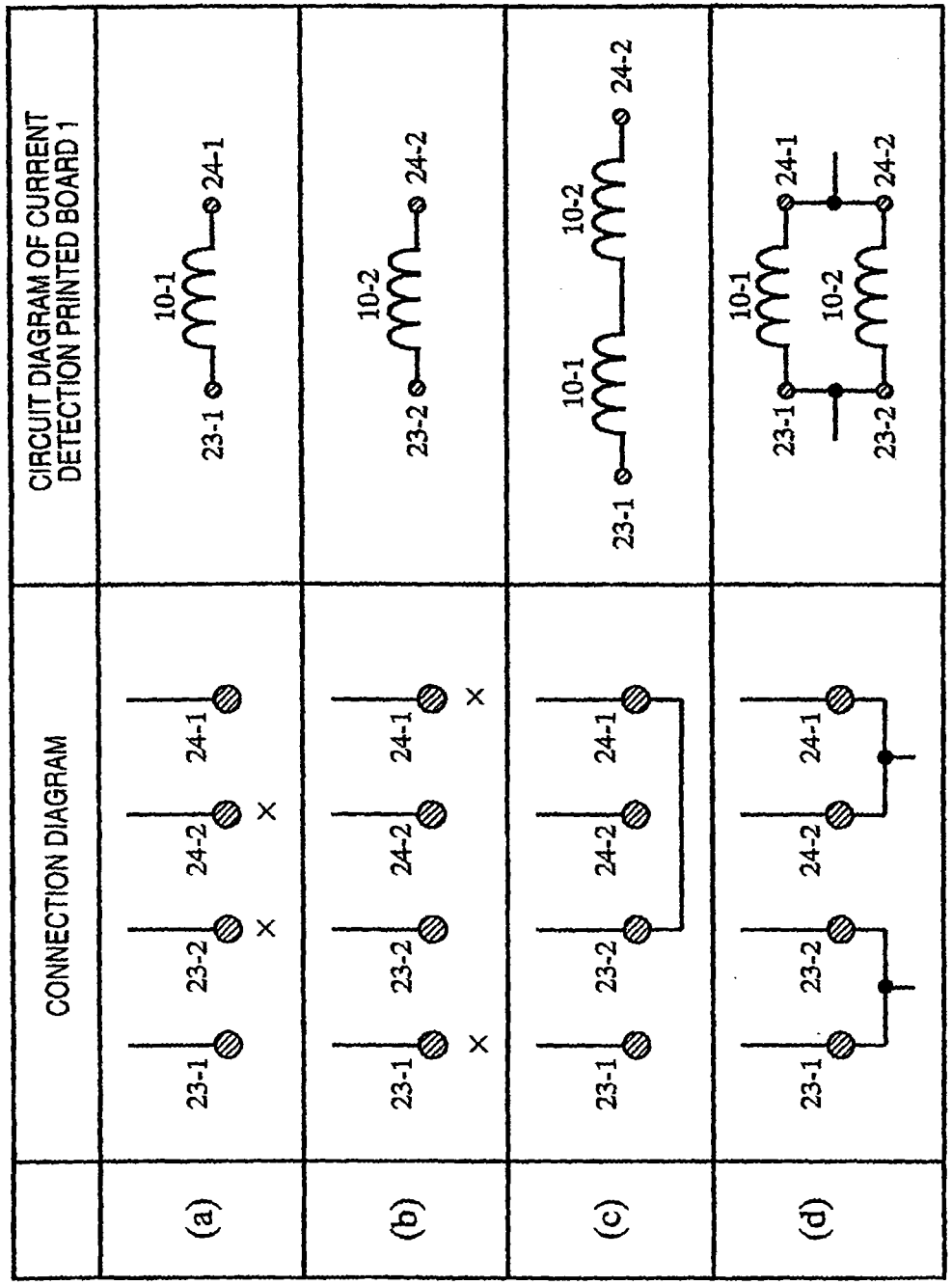
FIG. 6 is a connection diagram of the current detection printed board 1 shown in FIG. 5.

FIG. 6 is a connection diagram of the current detection printed board 1 shown in FIG. 5.

As shown in FIG. 5, output terminals 23-1 and 24-1 are connected to both ends 10-1a and 10-1b of the first coiled wire 10-1. Further, output terminals 23-2 and 24-2 are connected to both ends 10-2a and 10-2b of the second coiled wire 10-2. In this case, with the connection shown in FIG. 6, various kinds of current transformers can be formed in one current detection printed board 1. Moreover, in FIG. 6, 'x' means non-connection to other terminals.

Specifically, in case of connection (a) in FIG. 6, a current transformer using the first coiled wire 10-1 is formed in the current detection printed board 1.

In case of connection (b) in FIG. 6, a current transformer using the second coiled wire 10-2 is formed in the current detection printed board 1.

In case of connection (c) in FIG. 6, if the output terminal 23-2 and the output terminal 24-1 are connected to each other, a current transformer when the first coiled wire 10-1 and the second coiled wire 10-2 are connected in series to each other is formed. Therefore, in this case, a current transformer having larger inductance can be formed, compared with the cases (a) and (b) in FIG. 6.

In addition, like connection (d) in FIG. 6, if the output terminal 23-1 and the output terminal 23-2 are connected to each other, and the output terminal 24-1 and the output terminal 24-1 are connected to each other, a current transformer when the first coiled wire 10-1 and the second coiled wire 10-2 are connected in parallel with each other.

Figure 7:
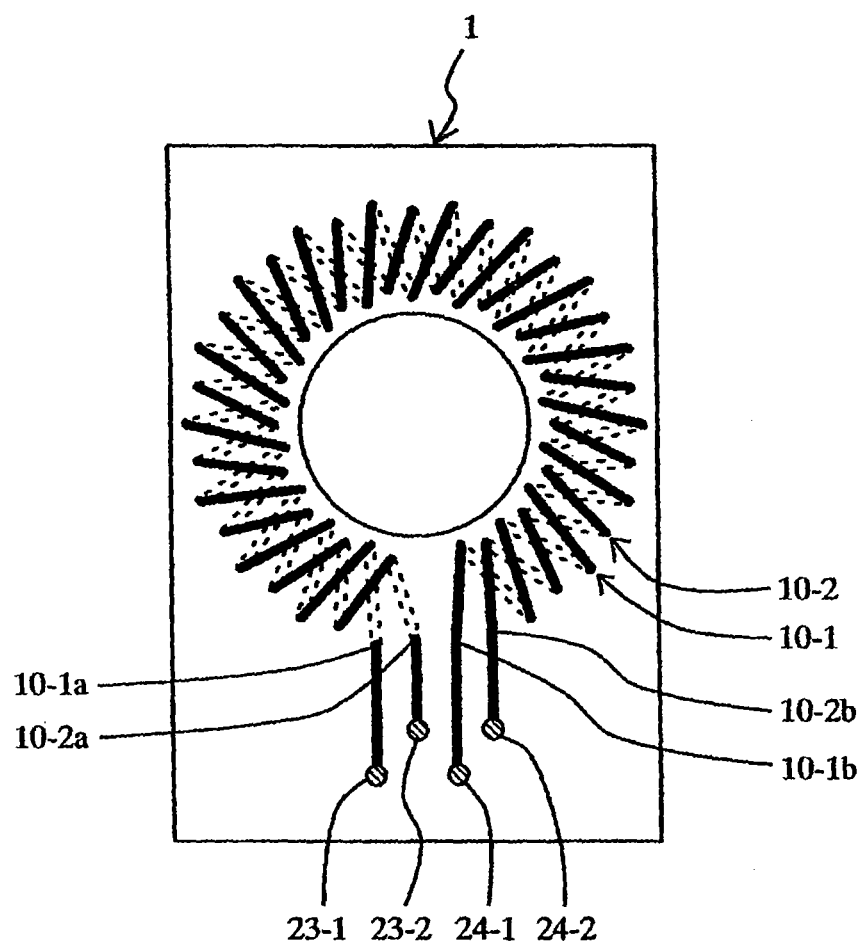
FIG. 7 is a diagram showing another example of the current detection printed board 1 according to the invention.

FIG. 7 is a diagram showing another example of the current detection printed board 1 according to the invention. In the current detection printed board 1, like FIG. 5, the first coiled wire 10-1 and the second coiled wire 10-2 are provided in one current detection printed board 1. The current detection printed board 1 of FIG. 7 is different from that of FIG. 5 in that the first coiled wire 10-1 and the second coiled wire 10-2 are disposed to have a double helix structure. Further, in FIG. 7, like FIG. 5, various kinds of current transformers can be formed in one current detection printed board 1. Moreover, in FIGS. 5 and 7, for ease discrimination of the wires, the positions of the output terminals are shifted from each other, but the invention is not limited thereto. Various kinds of position relationship may be adopted.

As shown in FIG. 7, the first coiled wire 10-1 and the second coiled wire 10-2 can be arranged to have a double helix structure. Alternatively, many arrangement examples may be considered, in addition to the example shown in FIG. 7.

FIGS. 8A to 8E are diagrams showing the arrangement examples of the first coiled wire 10-1 and the second coiled wire 10-2. FIGS. 8A to 8E schematically show the sections of the first coiled wire 10-1 and the second coiled wire 10-2 and show various arrangement examples. Moreover, the first coiled wire 10-1 and the second coiled wire 10-2 are shifted from each other with respect to a backward direction as viewed from the paper. Since portions that are not typically viewed are shown in perspective view for explanation, the wires may seem to overlap each other.

Figure 8A:
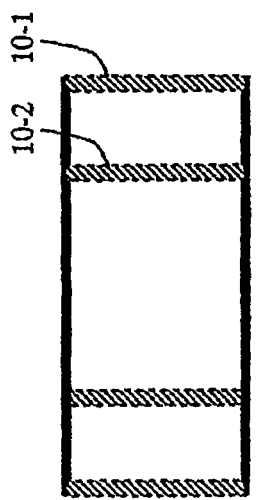
FIGS. 8A to 8E are diagrams showing the arrangement examples of the first coiled wire 10-1 and the second coiled wire 10-2.

For example, FIG. 8A shows an example where the first coiled wire 10-1 and the second coiled wire 10-2 are formed in the same conductive layer. In this case, the pattern wire of the first coiled wire 10-1 is longer than that of the second coiled wire 10-2. Of course, the pattern wire of the second coiled wire 10-2 may be longer than that of the first coiled wire 10-1.

Figure 8B:

FIG. 8B shows an example where the first coiled wire 10-1 and the second coiled wire 10-2 are formed in the same conductive layer, like FIG. 8A. However, the pattern wires of the first coiled wire 10-1 and the second coiled wire 10-2 have the same length.

Figure 8C:
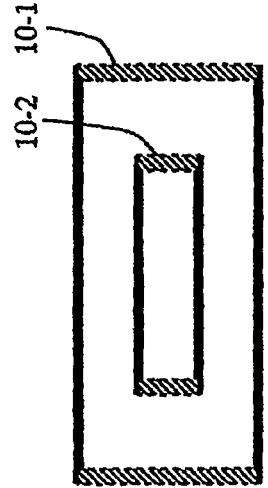

FIG. 8C shows an example where the through hole of the second coiled wire 10-2 is formed further towards the inside than the first coiled wire 10-1, and the pattern wire of the second coiled wire 10-2 is formed in a conductive layer inside the first coiled wire 10-1.

Figure 8D:
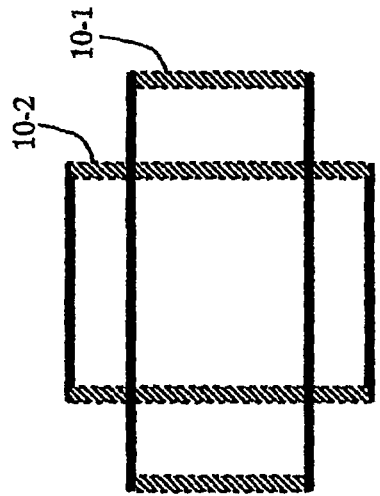

FIG. 8D shows an example where the through hole of the second coiled wire 10-2 is formed further towards the inside than the first coiled wire 10-1, and the pattern wire of the second coiled wire 10-2 is formed in a conductive layer outside the first coiled wire 10-1.

Figure 8E:

FIG. 8E shows an example where the through hole of the second coiled wire 10-2 is formed further towards the outside than the first coiled wire 10-1, and the pattern wire of the second coiled wire 10-2 is formed in a conductive layer inside the first coiled wire 10-1.

In addition, various modifications can be considered and easily considered from the above examples, and thus the descriptions thereof will be omitted. Moreover, as shown in FIGS. 8A and 8B, when the pattern wires of the first coiled wire 10-1 and the second coiled wire 10-2 are formed in the same conductive layer, a double-sided board can be used.

In FIGS. 8A to 8E, as the current detection printed board 1 is viewed in plan view, the through holes and the pattern wires of the first coiled wire 10-1 and the second coiled wire 10-2 are shifted from each other. With this configuration, various arrangement examples can be made. Alternatively, as shown in FIG. 8C, if the through hole of the second coiled wire 10-2 is formed further towards the inside than the through hole of the first coiled wire 10-1, and the pattern wire of the second coiled wire 10-2 is formed further towards the inside than the pattern wire of the first coiled wire 10-1, as viewed in plan view, the pattern wires of the first coiled wire 10-1 and the second coiled wire 10-2 may be partially overlap each other. Of course, the relationship between the first coiled wire 10-1 and the second coiled wire 10-2 may be reversed.

In FIGS. 5 and 7, an example where the two coiled wires 10 are provided in one current detection printed board 1 has been illustrated, but the number of coiled wires is not limited thereto. For example, three or more coiled wires 10 may be provided in one current detection printed board 1. Of course, with this configuration, the number of combinations of the coiled wires 10 to be formed in one current detection printed board 1 can be increased. Further, as described below, when the current conversion circuit 51 is provided on the current detection printed board 1, the same can be applied. In this case, as described above, the wires may be connected near both ends of the coiled wires 10 or may be connected in the current conversion circuit 51. That is, both ends of each wire or positions electrically identical to both ends thereof are electrically connectable to both ends of another wire or positions electrically identical to both ends thereof.

Next, the effects of a case where a plurality of coiled wires 10 are provided in the current detection printed board 1, as shown in FIGS. 5 and 7, will be described.

In general, a coil (also referred to as an inductor) has a frequency characteristic, and the characteristic changes according to a frequency to be used. Specifically, a detection level of a current is low in a region where a frequency is low. For this reason, the coil is used in a region where a frequency is high. However, an excessively high frequency causes resonance. A frequency at the time of resonance is referred to as a resonant frequency. Near the resonant frequency, a change in detection level of a current is excessively large, and thus it is unsuitable for current detection. For this reason, schematically, a detectable frequency band is limited. That is, a usable frequency has an upper limit and a lower limit.

If inductance of the coil becomes large, the detectable frequency band goes toward a lower frequency. Meanwhile, if inductance of the coil becomes small, the detectable frequency band goes toward a higher frequency. For this reason, it is necessary to select inductance of the coiled wire 10 to an appropriate value using a frequency of an AC current flowing in the power transmission conductor 66.

The above-described high-frequency power supply device 61 outputs different frequencies of high-frequency power according to the uses. For example, a frequency of 2 MHz, 13.56 MHz, or the like is used according to the uses. For this reason, since it is necessary to select inductance of the coiled wire 10 according to the frequencies. Accordingly, if various kinds of current transformers can be formed in one current detection printed board 1, convenience can be increased. For example, if both the current transformer for 2 MHz and the current transformer for 13.56 MHz can be formed, it is unnecessary to prepare the current detection printed boards 1 for the individual frequencies. Therefore, kinds of products can be reduced.

Like the examples shown in FIGS. 1A to 1D and FIGS. 3A to 3E, when the coiled wire 10 is a simplex wound wire, there is a limit to increase the number of turns. Then, there is also a limit to increase inductance. Here, in case of serial connection indicated by (c) of FIG. 6, inductance of the coiled wire 10 can be increased, and thus the detectable frequency band can be made low.

(2) Voltage Detection Printed Board

FIGS. 9A to 9D are diagrams showing an example of a voltage detection printed board 2 according to the invention.

Specifically, FIG. 9A is a plan view of the voltage detection printed board 2. FIG. 9B is a schematic view of a portion (a portion C surrounded by a dotted line) of FIG. 9A on magnified scale. FIG. 9C is a diagram showing linear expansion for simplification of FIG. 9B. FIG. 9D shows a wire of the voltage detection printed board 2 when FIG. 9C is viewed from the side. Moreover, as regards the wire shown in FIG. 9D, portions that are not typically viewed are shown in perspective view for explanation.

As shown in FIGS. 9A to 9D, the voltage detection printed board 2 has a penetration hole 201 that penetrates a board, and a ring-shaped wire 30 that is provided in the vicinity of the penetration hole 201. The ring-shaped wire 30 is formed by, along the periphery of the penetration hole 201, providing a plurality of through holes 31 that penetrate the board and patterns wires 32 and 33 that connect the through holes to a front surface 221 and a rear surface 222 of the board. For this reason, the individual through holes are provided between the pattern wires 32 and 33 of the front surface of the rear surface of the board. Further, the thickness of each of the through holes is formed to have the substantially same thickness as the thickness of the board. In such a manner, the ring-shaped 30 is obtained.

Moreover, in FIGS. 9B and 9C, the pattern wires 32 and 33 of the front surface and the rear surface of the board overlap each other. Further, an output wire 40 is connected to the ring-shaped wire 30.

In the voltage detection printed board 2 in FIGS. 9A to 9D, when a power transmission conductor 66, in which an AC voltage is generated, is disposed to pass through the penetration hole 201, the ring-shaped wire 30 and a portion of the power transmission conductor 66 facing the ring-shaped wire 30 function as electrodes of a capacitor. That is, the printed board can have a function as the electrodes of the capacitor. Accordingly, portions of the ring-shaped wire 30 correspond to the electrode 91*b* of the capacitor of the circuit diagram in FIG. 27.

With this configuration, the portions of the ring-shaped wire 30 are formed by the through holes 31 or the pattern wires 32 and 33. Accordingly, there is almost no variation in shape or position. Therefore, when a plurality of voltage detection printed boards 2 are formed, a variation in voltage detection value of the individual voltage detection printed boards 2 can be reduced.

Moreover, as described below, a voltage conversion circuit 53 corresponding to the voltage conversion circuit shown in FIG. 27 may be provided on the voltage detection printed board 2 of FIGS. 9A to 9D. In this case, an output terminal 41 shown in FIGS. 9A to 9D is not required, and thus the output wire 40 of the ring-shaped wire 30 is directly connected to the voltage conversion circuit 53.

Moreover, the ring-shaped wire 30 is an example of a third wire of the invention (a first wire in the case of a voltage detector), and the output wire 40 is an example of a fourth wire of the invention (a second wire in the case of a voltage detector).

FIGS. 10A to 10E are diagrams showing another example of the voltage detection printed board 2 according to the invention.

Specifically, FIG. 10A is a plan view of the voltage detection printed board 2. FIG. 10B is a schematic view of a portion (a portion D surrounded by a dotted line) of FIG. 10A on magnified scale. FIG. 10C is a diagram showing linear expansion for simplification of FIG. 10B. FIG. 10D shows a wire of the voltage detection printed board 2 when FIG. 10C is viewed from the side. FIG. 10E shows the wire of the voltage detection printed board 2 paying emphasis on the output wire 40 as viewed from the side. Moreover, as regards the wire shown in FIGS. 10A to 10E, portions that are not typically viewed are shown in perspective view for explanation. In addition, for convenience, the voltage detection printed board 2, through holes 31, pattern wires 32 and 33, and the like are represented by the same reference numerals as those in FIGS. 9A to 9D.

The voltage detection printed board 2 shown in FIGS. 10A to 10E is specifically the same as the voltage detection printed board 2 shown in FIGS. 9A to 9D, except that the board has a multilayer structure, and the ring-shaped wire 30 is formed between inner layers. This is the same as FIGS. 3A to 3E, and the description thereof will be omitted.

For this reason, in FIGS. 10A to 10E, the ring-shaped wire 30 is formed between a first conductive layer 231 and a second conductive layer 232. Accordingly, the ring-shaped wire 30 may not be viewed. Further, in this case, the portions of the ring-shaped wire 30 correspond to the electrode 91b of the capacitor of the circuit diagram in FIG. 27.

The ring-shaped wire 30 is formed by pattern wires 40a connected to one end 30a of the ring-shaped wire 30 formed in the first conductive layer 231, through holes 40b, and pattern wires 40c formed on the front surface of the board 40c, as shown in FIG. 10E. The output wire 40 is connected to an output terminal 41.

Figure 11A:
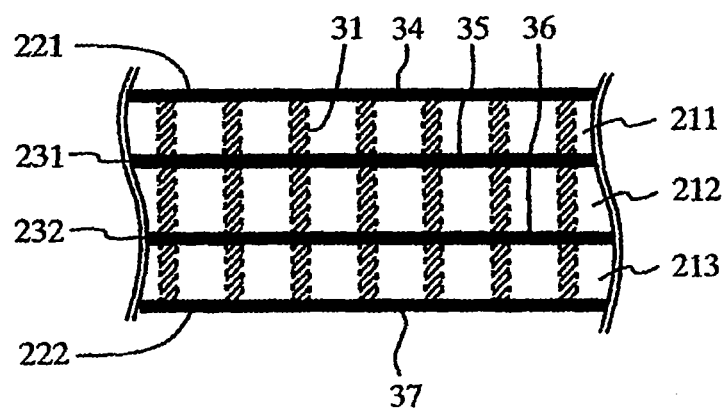
FIGS. 11A and 11B show another example of a ring-shaped wire 30.
Figure 11B:
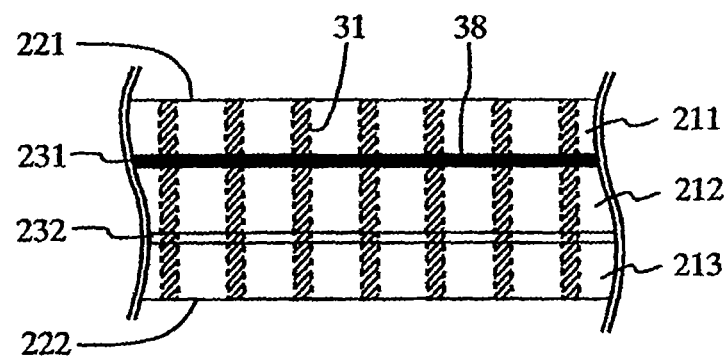

Moreover, unlike the above description, as shown in FIGS. 11A and 11B, the ring-shaped wire 30 may be formed.

FIGS. 11A and 11B show another example of the ring-shaped wire 30.

FIG. 11A shows an example where an additional pattern wire for connecting the through holes is provided between a top conductive layer and a bottom conductive layer at penetration portions of the through holes 31. In this example, four pattern wires of a pattern wire 34, a pattern wire 35, a pattern wire 36, and a pattern wire 37 are provided in sequence from the upper portion of the board. As such, three or more pattern wires may be provided.

FIG. 11B shows an example where a pattern wire 38 is provided in only one layer between the top conductive layer and the bottom conductive layer at the penetration portions of the through holes 31. As such, only one pattern wire may be provided.

Accordingly, a pattern wire may be provided in at least one layer between the top conductive layer and the bottom conductive layer at the penetration portions of the through holes so as to connect the through holes. In this case, the portions of the ring-shaped wire 30 correspond to the electrode 91b of the capacitor of the circuit diagram in FIG. 27.

(3) Current/Voltage Detector

FIGS. 12A to 12C are schematic exterior views of a current/voltage detector 3 according to a third embodiment of the invention. Specifically, FIG. 12A is a schematic exterior view three-dimensionally showing the current/voltage detector 3. FIG. 12B is a schematic exterior view of a conductor casing as viewed from the side. FIG. 12C is a diagram when the conductor casing of FIG. 12B is removed.

As shown in FIG. 12A, like the related art, the current/voltage detector 3 has a structure in which a power transmission conductor 66 can penetrate a casing. Moreover, the power transmission conductor 66 and an insulator 69 surrounding the power transmission conductor 66 are not included in the current/voltage detector 3 but are just shown for explanation. Further, the insulator 69 insulates the power transmission conductor 66 and the current/voltage detector 3. For this reason, an actual length of the insulator 69 is shorter than the length of the insulator 69 shown in the drawing, but it is shown like FIG. 12A for simplification of the drawing. The same is applied to other drawings (for example, FIG. 17).

As shown in FIG. 12C, the current detection printed board 1 and the voltage detection printed board 2 are accommodated in the casing. For this reason, a current that flows in the power transmission conductor 66 passing through the casing can be detected by the current detection printed board 1, and a voltage that is generated in the power transmission conductor 66 can be detected by the voltage detection printed board 2.

That is, in the example shown in FIG. 12B, a left portion of the current/voltage detector 3 corresponds to a current detector 310 and a right portion thereof corresponds to a voltage detector 320. Moreover, the casing is formed of a conductor, such as aluminum or the like. Then, the current detector 310 corresponds to the current detector 80 shown in FIG. 27, and the voltage detector 320 corresponds to the voltage detector 90 shown in FIG. 27.

FIGS. 13A and 13B are diagrams showing the schematic configuration of the current/voltage detector 3 shown in FIGS. 12A to 12C. Specifically, FIG. 13A is a diagram showing the configuration of the current/voltage detector 3. FIG. 13B is a schematic view showing when individual parts of FIG. 13A are assembled. Moreover, in FIGS. 13A and 13B, the shapes of the individual parts are schematic. For example, a penetration hole through which the power transmission conductor 66 passes or an opening through which a magnetic flux passes is provided in the casing or the board, but it is not shown in the drawings. Further, in FIGS. 13A and 13B, portions that are not viewed from the outside are schematically indicated by dotted lines.

As shown in FIG. 13A, the current/voltage detector 3 has a casing main body 300, and the current detection printed board 1, the voltage detection printed board 2, a current detector cover 301, and a voltage detector cover 302 that are fixed to the casing main body 300. Of course, parts, such as screws or beads, for fixing the above-described constituents, but they are regarded as portions of the constituents and are not shown for simplification of explanation. Further, as indicated by an arrow in FIG. 13A, if the constituents are fixed to the casing main body 300, as shown in FIG. 13B, the current detection printed board 1 and the voltage detection printed board 2 are fixed in the casing main body 300, and the current detection printed board 1 and the voltage detection printed board 2 are covered with the covers 301 and 302, respectively.

Moreover, in the casing main body 300, a portion where the current detection printed board 1 is fixed is an example of a first casing of the invention, and a portion where the voltage detection printed board 2 is fixed is an example of a second casing of the invention (a first cover in the case of a voltage detector). Further, the current detector cover 301 is an example of a first cover of the invention, and the voltage detector cover 302 is an example of a second cover of the invention (a first cover in the case of a voltage detector).

That is, like the related art, the current detection printed board 1 and the voltage detection printed board 2 are disposed in the casing. The casing main body 300 is common to the current detection printed board 1 and the voltage detection printed board 2. Then, if the current detection printed board 1 is fixed on the front surface of the casing main body 300, the voltage detection printed board 2 is fixed on the rear surface thereof. Accordingly, the current detection printed board 1 and the voltage detection printed board 2 are accommodated in separate spaces, respectively. Therefore, there is almost no mutual interference between the current detection printed board 1 and the voltage detection printed board 2, and detection accuracy increases.

Next, other parts than the current detector cover 301 and the voltage detector cover 302 will be specifically described.

FIGS. 14A to 14C are diagrams of the casing main body 300. Specifically, FIG. 14A is a diagram as viewed from a side on which the current detection printed board 1 is fixed. FIG. 14B is a cross-sectional view of a side surface of the casing main body 300. FIG. 14C is a diagram as viewed from a side on which the voltage detection printed board 2 is fixed.

Figure 15A:
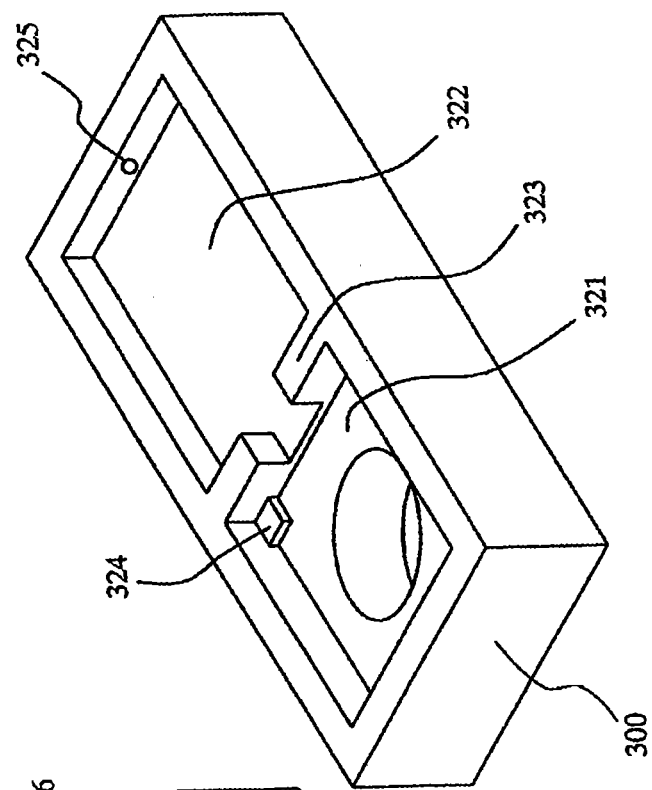
FIGS. 15A and 15B are diagrams three-dimensionally showing the casing main body 30.
Figure 15B:
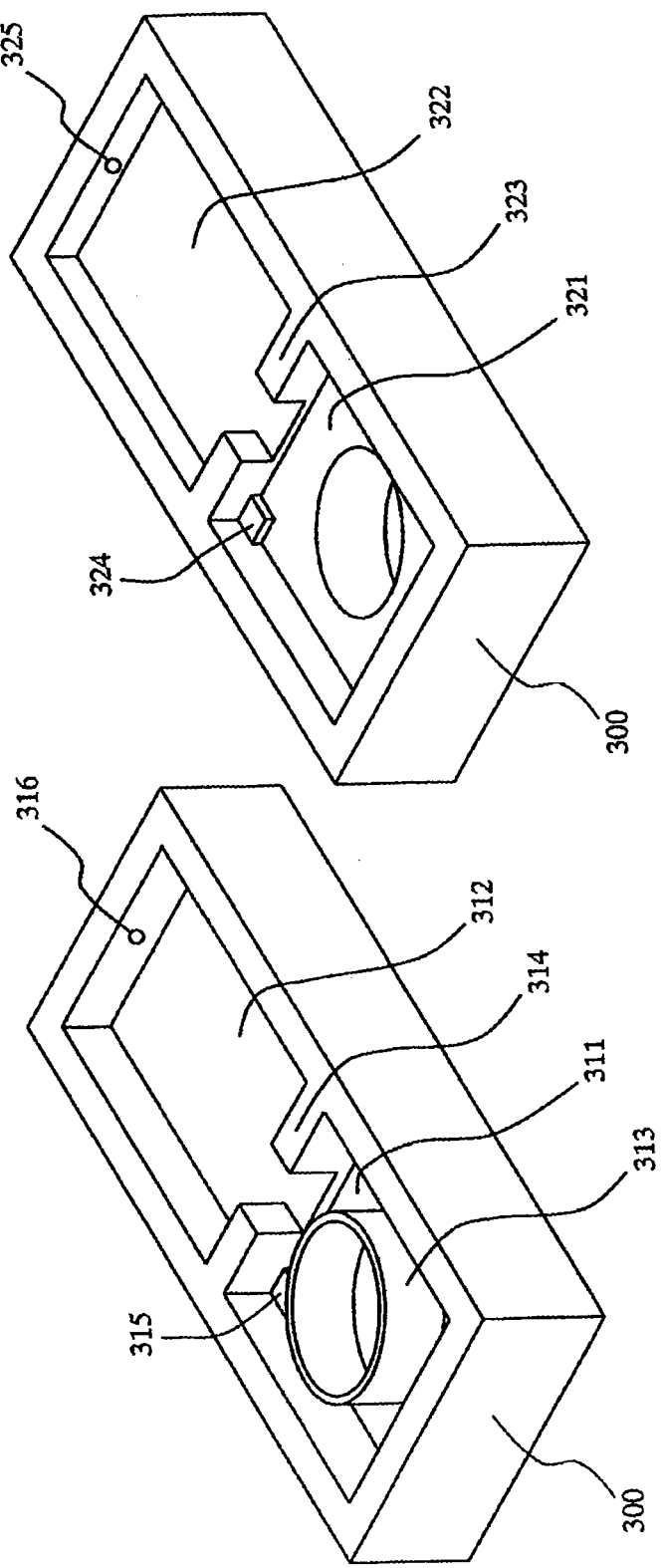

FIGS. 15A and 15B are diagrams three-dimensionally showing the casing main body 300. Specifically, FIG. 15A is a diagram as viewed from the side on which the current detection printed board 1 is fixed, and FIG. 15B is a diagram as viewed from the side on which the voltage detection printed board 2.

FIGS. 16A and 16B are diagrams when the current detection printed board 1 and the voltage detection printed board 2 are mounted on the casing main body 300 in a state where the current detector cover 301 and the voltage detector cover 302 are not mounted. Specifically, FIG. 16A is a diagram of the current detection printed board 1 side. FIG. 16B is a diagram of the voltage detection printed board 2 side.

As shown in FIGS. 14A to 16B, a through hole 303 and concave portions 311, 312, 321, and 322 are provided in the casing main body 300. Accordingly, the power transmission conductor 66 and the insulator 69 covering the power transmission conductor 66 pass through the casing main body, and the current detection printed board and the voltage detection printed board 2 are accommodated in the casing main body. Moreover, the current detection printed board 1 is accommodated on a side where the concave portions 311 and 312 are provided, and the voltage detection printed board 2 is accommodated on a side where the concave portions 321 and 322 are provided.

Four board fixing portions 315 are provided at four corners of the concave portion 311, and the current detection printed board 1 is fixed to the portions. This is to allow the current detection printed board 1 to float with respect to the bottom surface of the concave portion 311 such that the coiled wire provided in the current detection printed board 1 does not come into contact with the casing.

Similarly, four board fixing portions 324 are provided at four corners of the concave portion 321 such that the voltage detection printed board 2 floats with respect to the bottom surface of the concave portion 321.

For example, unlike FIGS. 3A to 3E, when the coiled wire 10 of the current detection printed board 1 is not formed on the rear surface layer of the board, the board fixing portions 315 provided at the four corners of the concave portion 311 can be removed. Then, the height of the bottom surface of the concave portion 311 can be the same as the height of the bottom surface of the concave portion 312. For this reason, the structure of the casing main body 300 can be simplified. Similarly, for example, unlike FIGS. 10A to 10E, when the ring-shaped wire 30 of the voltage detection printed board 2 is not formed in the rear surface layer of the board, the board fixing portions 324 provided at the four corners of the concave portion 321 can be removed, and thus the height of the bottom surface of the concave portion 321 can be the same as the height of the bottom surface of the concave portion 322. For this reason, the structure of the casing main body 300 can be simplified.

Further, on the current detection printed board 1 side of the casing main body 300, a first shield portion 313 that shields a magnetic flux is provided in the vicinity of the penetration hole.

Next, the current detection printed board 1 and the voltage detection printed board 2 will be respectively described.

(Description of Current Detection Printed Board 1)

The coiled wire 10 of the current detection printed board 1 is the same as that of the current detection printed board 1 in FIGS. 1A to 1D, but the output wires 21 and 22 are connected to the current conversion circuit 51 in forms of the pattern wires. The current conversion circuit 51 corresponds to the current conversion circuit 84 shown in FIG. 27.

Accordingly, unlike the current detection printed board 1 in FIG. 1, the coiled wire 10 and the current conversion circuit 51 are provided on the same board. Further, the output wire 52 connected to the current conversion circuit 51 extends towards the outside of the casing through a wire opening 316. Moreover, the current conversion circuit 51 has an output terminal to which the output wire 52 is connected. In addition, the output wire 52 may be partially a pattern wire or may be overall a wire other than the pattern wire.

In the casing main body, a second shield portion 314 is provided at a corresponding position between the coiled wire 10 of the current detection printed board 1 and the current conversion circuit 51. For this reason, the current detection printed board 1 has a shape having a partially narrower width according to the second shield portion 314.

Moreover, the current conversion circuit 51 is an example of a first conversion circuit of the invention, and the output wire 52 is an example of a fifth wire of the invention (a third wire in the case of a current detector).

(Description of Voltage Detection Printed Board 2)

The ring-shaped wire 30 of the voltage detection printed board 2 is the same as the voltage detection printed board 2 in FIGS. 1A to 1D, but the output wire 40 is connected to the voltage conversion circuit 53 in forms of the pattern wire. The voltage conversion circuit 53 corresponds to the voltage conversion circuit 93 in FIG. 27.

Accordingly, unlike the voltage detection printed board 2 in FIG. 1, the ring-shaped wire 30 and the voltage conversion circuit 53 are provided on the same board. Further, the output wire 54 connected to the voltage conversion circuit 53 extends towards the outside of the casing through a wire opening 325. Moreover, the voltage conversion circuit 53 has an output terminal to which the output wire 54 is connected. In addition, the output wire 54 may be partially a pattern wire or may be overall a wire other than the pattern wire.

In the casing main body, a third shield portion 323 is provided at a corresponding position between the ring-shaped wire 30 of the voltage detection printed board 2 and the voltage conversion circuit 53. For this reason, the voltage detection printed board 2 has a partially narrower width according to the third shield portion 323.

Moreover, the voltage conversion circuit 53 is an example of a second conversion circuit of the invention (a first conversion circuit in the case of a voltage detector), and the output wire 54 is an example of a sixth wire of the invention (a third wire in the case of a voltage detector).

(Effects of Casing)

Next, the effects of the casing will be described.

(i) Effects of Current Detection Opening 317

FIG. 17 is a cross-sectional view showing a case where the power transmission conductor 66 and the insulator 69 covering the power transmission conductor 66 penetrate the current/voltage detector 3. FIG. 17 shows a state where the current detector cover 301 and the voltage detector cover 302 are mounted. Moreover, the board fixing portions 315 and 324 shown in FIGS. 14A to 14C and the like are not shown. Further, the current detection printed board 1 and the voltage detection printed board 2 are partially omitted. In addition, as shown in FIG. 17, a penetration hole, through which the power transmission conductor 66 and the insulator 69 covering the power transmission conductor 66 passes, is provided in the current detector cover 301 and the voltage detector cover 302.

If a current flows in the power transmission conductor 66, a magnetic flux occurs around the conductor. The magnetic flux acts on the coiled wire 10 provided in the current detection printed board 1, such that a current flows in the coiled wire 10. Then, the current flowing in the coiled wire 10 is detected, thereby recognizing the current flowing in the power transmission conductor 66. For this reason, if the power transmission conductor 66 and the current detection printed board 1 are shielded by the conductor casing, the magnetic flux does not act on the current detection printed board 1, and thus the current cannot be detected. Accordingly, an opening 317, through which the magnetic flux generated around the conductor is introduced into the casing, is provided in the casing. The opening 317 is formed by a gap between the first shield portion 313 and the current detector cover 301.

(ii) Effects of Second Shield Portion 314

An electromagnetic wave is generated by an AC current flowing in the power transmission conductor 66. Since the electromagnetic wave has an effect on a circuit characteristic, it is necessary to prevent the electromagnetic wave from entering the current conversion circuit 51, if possible. For this reason, the second shield portion 314 is provided in the casing, thereby realizing an electromagnetic shield effect and keeping a good circuit characteristic of the current conversion circuit 51.

Moreover, the second shield portion 314 is formed by narrowing the board width. This is to shield an electromagnetic wave passing through the inside of the board. That is, the reason why the second shield portion 314 having a narrower board width is formed is that, when the second shield portion 314 is provided to cover the upper portion of the board, without narrowing the board width, an electromagnetic wave passes through the portions of the board, and thus an electromagnetic shield effect becomes weak.

Figure 18A:
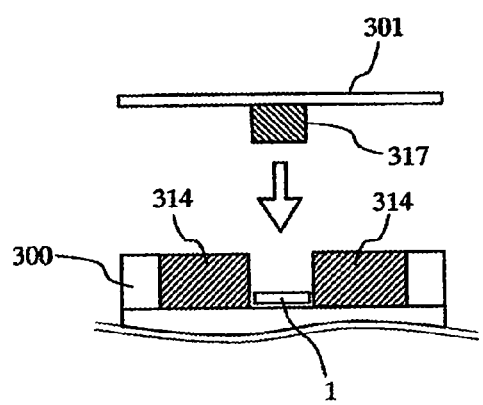
FIGS. 18A and 18B show an example of an application of a second shield portion 314.
Figure 18B:
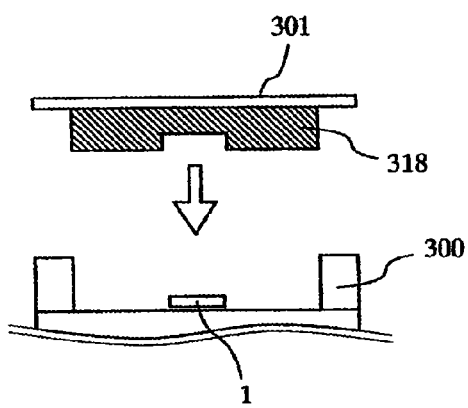

FIGS. 18A and 18B show an example of an application of the second shield portion 314.

As shown in FIGS. 14A to 16B, since only with the second shield portion 314 of the casing main body 300, a gap occurs in the output wires 21 and 22 of the coiled wire 10, electromagnetic shield may not be sufficient. In this case, as shown in FIG. 18A, a shield portion 317 for burying the gap may be provided in the current detector cover 301. In such a manner, the gap in the output wires 21 and 22 is almost removed, and thus an electromagnetic shield effect increases.

Further, as shown in FIG. 18B, instead of the second shield portion 314, a shield portion 318 may be provided in the current detector cover 301.

Moreover, as for the third shield portion 323 of the voltage detection printed board 2 side, the same one as the shield portion 317 or the shield portion 318 provided in the current detector cover 301 may be provided in the voltage detector cover 302, thereby increasing an electromagnetic shield effect. This is the same as FIGS. 18A and 18B, and the description thereof will be omitted.

As described above, as for the current detection and voltage detection sides, the casing main body 300 is formed as a single body. For this reason, as described above, current detection and voltage detection can be performed in separate spaces, and the outputs can be converted into voltage levels using the individual conversion circuits. Therefore, there is almost no mutual interference, and thus detection accuracy can be improved.

(Modification of Current/Voltage Detector)

Figure 19A:
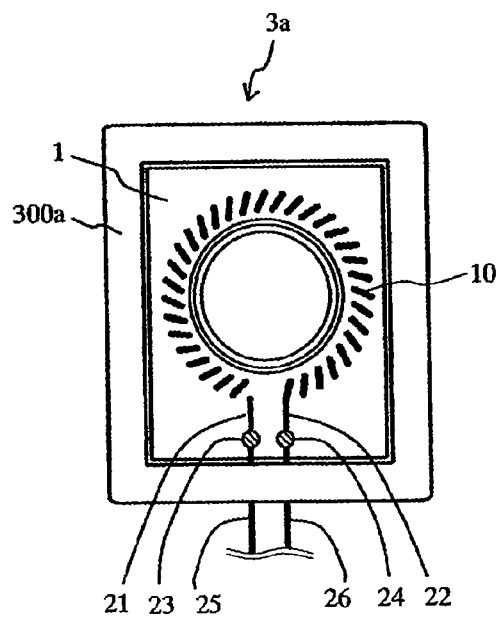
FIGS. 19A and 19B show a modification of the current detection printed board 1, the voltage detection printed board 2, and the casing.
Figure 19B:
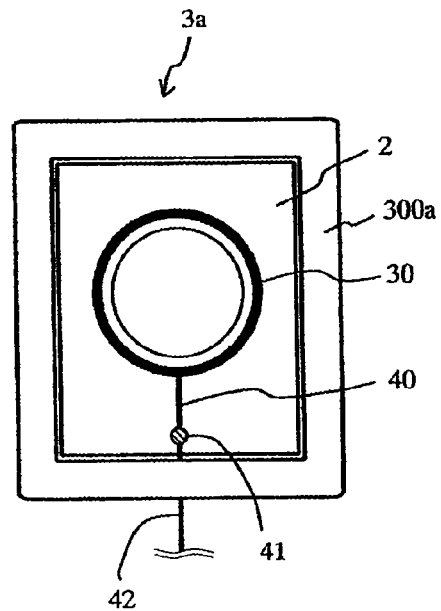

FIGS. 19A and 19B show a current/voltage detector 3a as a modification of the current/voltage detector 3. However, a current detector cover 301a and a voltage detector cover 302a are not shown. In FIGS. 19A and 19B, the current detection printed board 1 is as shown in FIGS. 1A to 1D, and the voltage detection printed board 2 is as shown in FIGS. 9A to 9D. That is, the current conversion circuit 51 is not provided in the current detection printed board 1, and the voltage conversion circuit 53 is not provided in the voltage detection printed board 2. A casing main body 300a having a shape for the current detection printed board 1 and the voltage detection printed board 2 is used. For this reason, the output of the current detection printed board 1 is output outside the casing by output wires 25 and 26, not pattern wires. Further, the output of the voltage detection printed board 2 is output outside the casing by an output wire 42, not a pattern wire. Moreover, the output wires 25 and 26 are connected to a current conversion circuit 51 that is separately provided, and the output wire 42 is connected to the voltage conversion circuit 53 that is separately provided.

(4) Current Detector and Voltage Detector

In the above description, the current detector 310 and the voltage detector 320 are formed as a single body. However, the invention is not limited thereto, but the current detector 310 and the voltage detector 320 may be separately provided. Here, the same reference numerals as FIGS. 12A to 12C are used.

Figure 20:
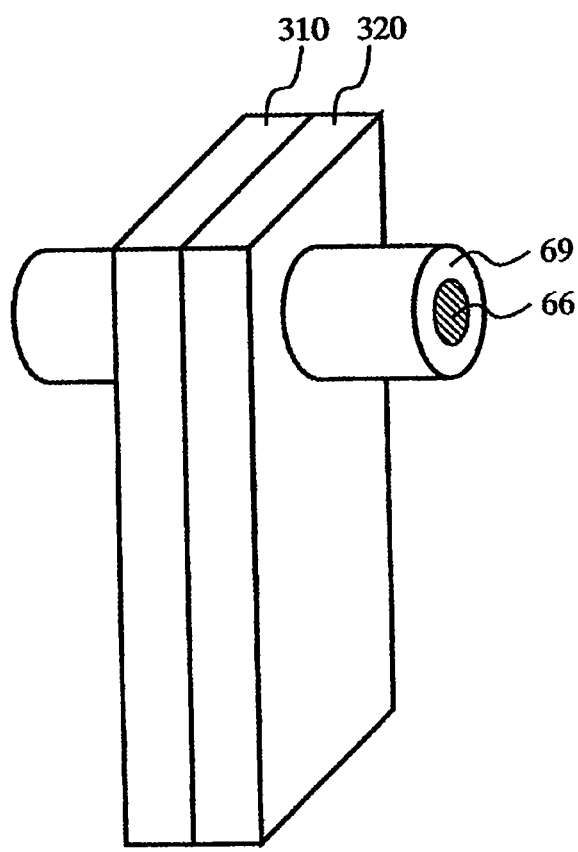
FIG. 20 is a diagram showing an example where the current detection printed board 1 and the voltage detection printed board 2 are accommodated in separate casings, thereby forming the current detector 310 and the voltage detector 320 separately.

FIG. 20 is a diagram showing an example where the current detection printed board 1 and the voltage detection printed board 2 are accommodated in separate casings, thereby forming the current detector 310 and the voltage detector 320 separately. As shown in FIG. 20, if the current detector 310 and the voltage detector 320 are provided separately and disposed such that both sides overlap each other, the same effects as the current detector and the voltage detector formed as a single body can be obtained.

Figure 21:
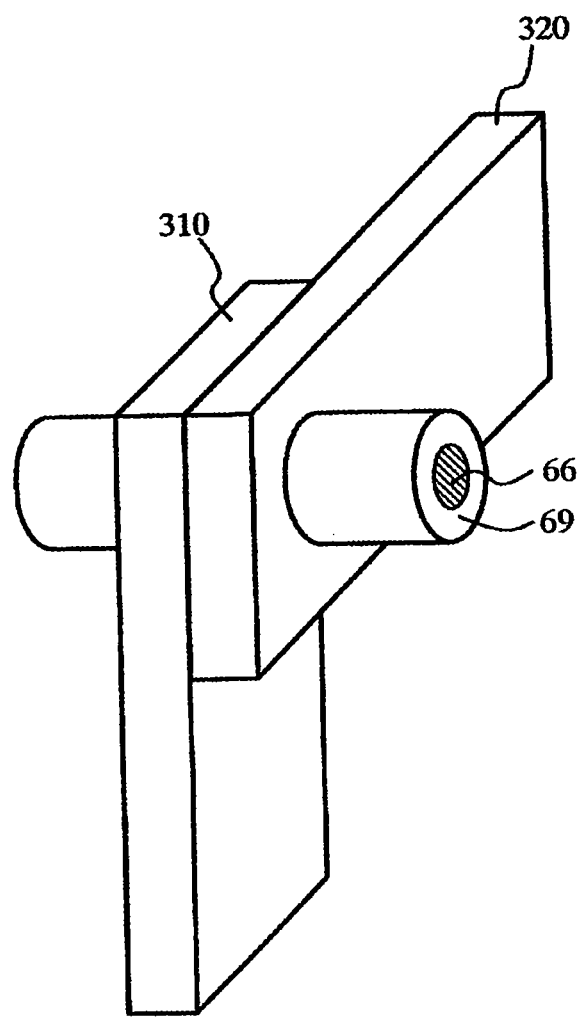
FIG. 21 is a diagram showing an application when the current detector 310 and the voltage detector 320 are provided separately.

FIG. 21 is a diagram showing an application when the current detector 310 and the voltage detector 320 are provided separately. As shown in FIG. 21, the current detector 310 and the voltage detector 320 may overlap each other in different directions, not in the same direction. Moreover, as shown in FIG. 21, if the penetration holes 303 provided in the individual detectors are coaxially located, the power transmission conductor 66 can be linear, and thus the structure can be simplified. Further, ease of assembling can be realized.

Although an example where the detector is provided at the input terminal 63a of the impedance matching device has been described in the above description, the invention is not limited thereto. For example, the detector may be provided at an output terminal of the high-frequency power supply device 61 or may be provided at the output terminal 63b of the impedance matching device. Moreover, as described above, there is a difference in current and voltage at the input terminal 63a and the output terminal 63b (the same as the input terminal of the load 65) of the impedance matching device. For this reason, when the detector is provided at the output terminal 63b of the impedance matching device or the input terminal of the load 65, in order to extend an insulation distance, it is preferable to use a power transmission conductor 68 having a large diameter or an insulator 69 covering the periphery of the power transmission conductor 68 in consideration of the difference. Further, the detector may be used for other systems other than the high-frequency power supply system.

Figure 22:
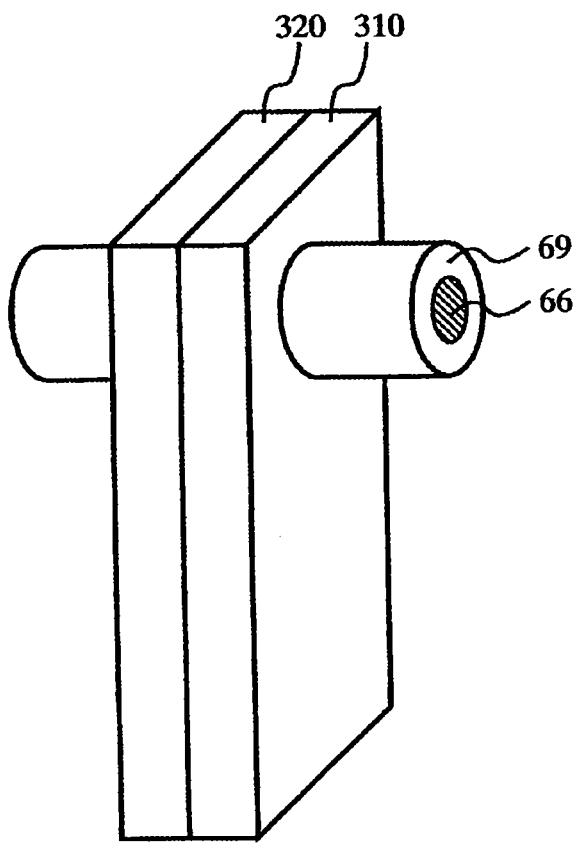
FIG. 22 is a diagram showing a case where the voltage detector 320 is disposed near the input and the current detector 310 is disposed at the back of the voltage detector 320.

Although a case where the current detector 310 is disposed near the input and the voltage detector 320 is disposed at the back of the current detector 310 has been described in the above description, as shown in FIG. 22, the voltage detector 320 may be disposed near the input.

Although an example where the current detector 310 and the voltage detector are used together has been described in the above description, either the current detector 310 or the voltage may be used.

(5) Fixing Method

When the outer diameter of the insulator 69 and the inner diameter of the penetration hole provided in the casing main body 300 are substantially consistent with each other, the insulator 69 and the current/voltage detector 3 can be fixed. However, actually, the insulator 69 having an outer diameter smaller than the inner diameter of the penetration hole may be used. In this case, a gap occurs between the insulator 69 and a casing main body 305. As such, if the gap exists, when the power transmission conductor 66 and the current/voltage detector 3 are mounted on the impedance matching device 63, the relative position therebetween may not be constant according to mounting devices. In this case, when a plurality of devices are formed, a variation in detection value of the individual devices occurs. For this reason, when the gap is large, it is preferable to keep the relative position between the power transmission conductor 66 and the current/voltage detector 3 constant.

Figure 23:
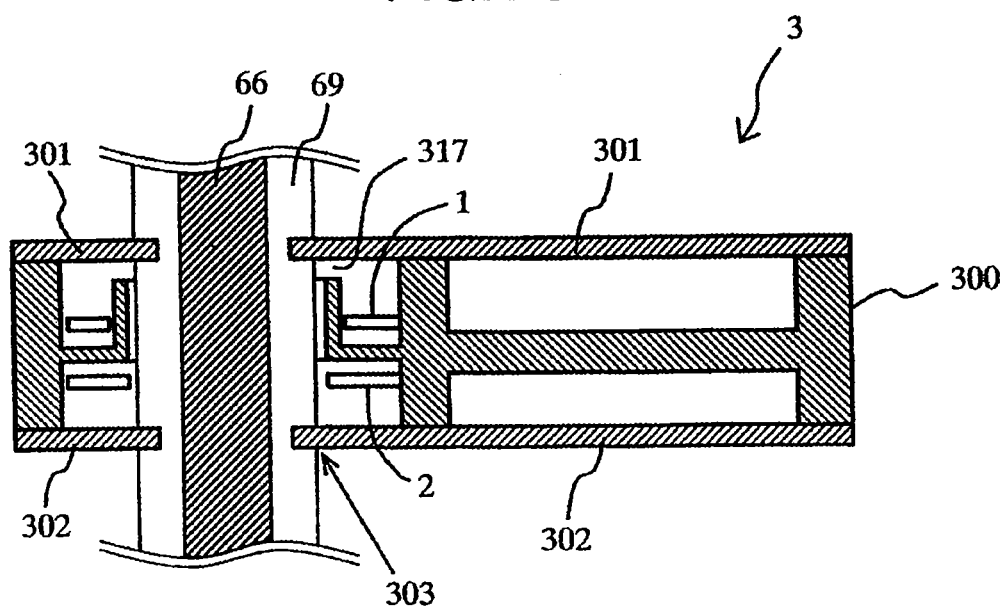
FIG. 23 is a diagram showing a fixing method of the insulator 69.

FIG. 23 is a diagram showing a fixing method of the insulator 69. As shown in FIG. 23, a concave portion is provided in the insulator 69, and the current detector cover 301 and the voltage detector cover 302 are fitted into the concave portion. With this configuration, the insulator 69 can be fixed by the current detector cover 301 and the voltage detector cover 302. Then, even though the outer diameter of the insulator 69 is smaller than the inner diameter of the penetration hole 303, the relative position between the power transmission conductor 66, and the current detection printed board 1 and the voltage detection printed board 2 can be substantially kept constant.

As described in FIG. 20 and the like, the fixing method can be applied to a case where the current detector 310 and the voltage detector 320 are provided separately.

Figure 24:
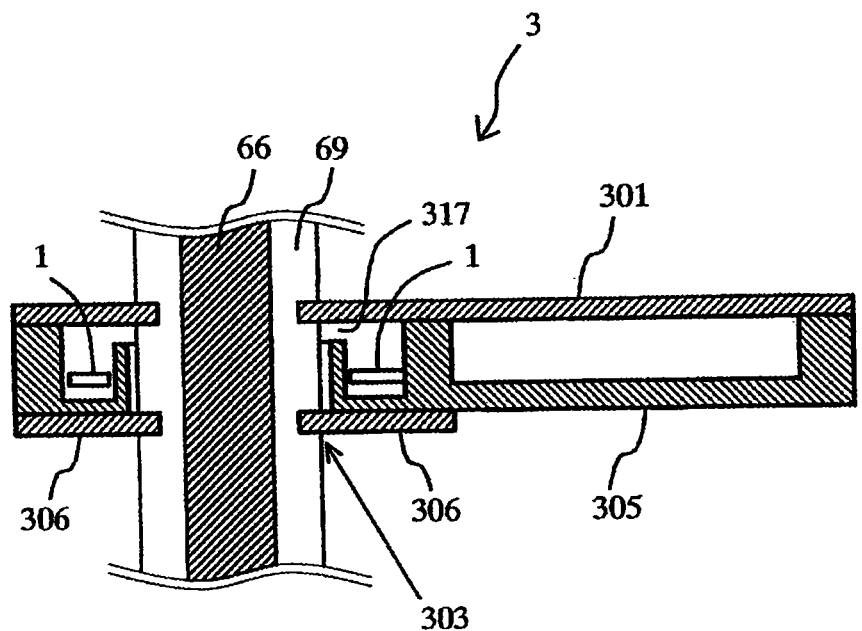
FIG. 24 is a diagram showing a fixing method of the insulator 69 when only the current detector 310 is used separately.

FIG. 24 is a diagram showing a fixing method of the insulator 69 when only the current detector 310 is used separately. Moreover, in FIG. 24, the casing main body of the current detector 310 is used as the casing main body 305. Further, in case of the voltage detector 320, the same method can also be adopted. Here, the description thereof will be omitted.

As shown in FIG. 20, when the current detector 310 and the voltage detector 320 are double-barreled, like FIG. 23, the insulator 69 can be fixed by the current detector cover 301 and the voltage detector cover 302. However, when either the current detector 301 or the voltage detector 302 is used, either an upper cover or a lower cover does not exist (as viewed from the paper). Then, the insulator 69 may not be stably fixed. In this case, as shown in FIG. 24, in order to stabilize the insulator, a mounting part 306 for fixing the insulator 69 may be provided at the lower portion of the casing main body 305 (as viewed from the paper). The mounting part 306 is fitted into the concave portion provided in the insulator 69 and is mounted on the casing main body 305 by beads or the like (not shown). Of course, the invention is not limited to the examples shown in FIGS. 23 and 24. For example, the shape of the mounting part 306 may be changed.

Figure 25:
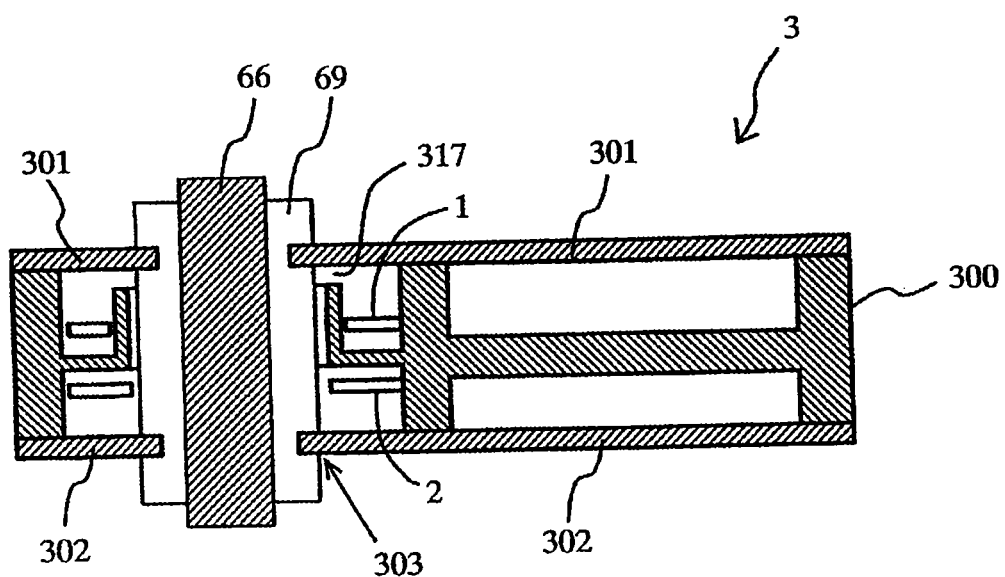
FIG. 25 is a diagram showing a case where the sizes of the power transmission conductor 66 and the insulator 69 are suited to the size of the current/voltage detector 3 in the current/voltage detector 3 shown in FIG. 23.
Figure 26:
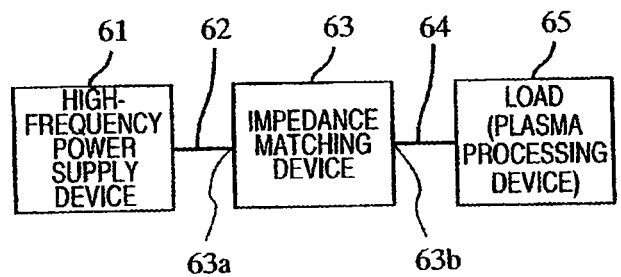
FIG. 26 is a block diagram of an example of a high-frequency power supply system that uses an impedance matching device.

FIG. 25 is a diagram showing a case where the sizes of the power transmission conductor 66 and the insulator 69 are suited to the size of the current/voltage detector in the current/voltage detector 3 shown in FIG. 23. Moreover, in the example of FIG. 24, the same method can also be adopted. Here, the description thereof will be omitted.

Like FIG. 23, when the insulator 39 is fixed to the current/voltage detector 3, in order to improve maintenance, as shown in FIG. 25, the sizes of the power transmission conductor 66 and the insulator 69 may be suited to the size of the current/voltage detector 3, such that the power transmission conductor 66 and the insulator 69 can be removed from the current/voltage detector 3. With this configuration, maintenance can be improved. Moreover, in FIG. 25, though not shown, a connection portion for connection to another conductor is provided in the power transmission conductor 66. Moreover, the current detector cover 301, the voltage detector cover 302, and the mounting part 306 of FIGS. 23 to 25 are an example of a fixing unit of the invention.

Although an example where high-frequency power having a frequency (for example, a frequency of hundreds kHz or more) of a radio frequency band is used has been described in the above description, AC power having a frequency lower than the frequency of the radio frequency band may be used. Meanwhile, in case of the high frequency, such as the frequency of the radio frequency band, it is necessary to shield the electromagnetic wave using the second shield portion 314 and the third shield portion 323 in the casing. Accordingly, when the frequency of AC power is low and an influence of the electromagnetic wave is negligible, the second shield portion 314 and the fourth shield portion 323 may not be provided. Besides, since characteristics are different according to the frequencies to be used, it is preferable to use a casing suitable for the characteristic.

Although a case where the power transmission conductors 66 and 68 are a cylindrical copper rod, that is, has a circular shape in section has been described in the above description, the invention is not limited thereto. For example, a conductor having an elliptical shape or a rectangular shape in section may be used. Further, although a case where the penetration hole 101 of the current detection printed board 1 and the penetration hole 201 of the voltage detection printed board 2 have a circular shape has been described, the invention is not limited thereto. For example, an elliptical shape or a rectangular shape may be used.

As described above, there exist various kinds of the current detection printed board, the voltage detection printed board, and the detectors using the same. Therefore, other combinations than those described above can be made.

What is claimed is:

1. A voltage detector comprising:
   a voltage detection printed board including:
      a board having a penetration hole that penetrates the board;
      a first pattern wire formed at a periphery of the penetration hole;
      a second pattern wire formed at the periphery of the penetration hole; and
      a plurality of through holes that penetrate the board between the first and second pattern wires; and
   a conductive casing in which the voltage detection printed board is fixed,
   wherein, when a conductor, in which an AC voltage is generated, is disposed to pass through the penetration hole, the pattern wires act with the conductor to function as electrodes of a capacitor.

2. The voltage detector according to claim 1, wherein the first pattern wire is formed on a top conductive layer of the board, and the second pattern wire is formed on a bottom conductive layer of the board.

3. The voltage detector according to claim 1, wherein the board comprises a plurality of layers, and the first and second pattern wires are formed between layers of the board.

4. The voltage detector according to claim 1, wherein the penetration hole has a circular shape, and the pattern wires are formed in a circular shape at the periphery of the penetration hole.

5. The voltage detector according to claim 1, wherein the AC voltage is an AC voltage having a frequency of a radio frequency band.

* * * * *